US012635177B2

(12) United States Patent
Takei et al.

(10) Patent No.: US 12,635,177 B2
(45) Date of Patent: May 19, 2026

(54) SILICON CARBIDE SEMICONDUCTOR DEVICE

(71) Applicant: FUJI ELECTRIC CO., LTD.,
Kawasaki (JP)

(72) Inventors: Manabu Takei, Shiojiri-city (JP);
Masakazu Baba, Tsukuba (JP);
Masakazu Okada, Tsukuba (JP);
Shinsuke Harada, Tsukuba (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 495 days.

(21) Appl. No.: 18/090,445

(22) Filed: Dec. 28, 2022

(65) Prior Publication Data

US 2023/0253493 A1 Aug. 10, 2023

(30) Foreign Application Priority Data

Feb. 7, 2022 (JP) ................................. 2022-017531

(51) Int. Cl.
*H10D 30/66* (2025.01)
*H10D 62/10* (2025.01)
*H10D 62/832* (2025.01)
(52) U.S. Cl.
CPC ......... *H10D 30/665* (2025.01); *H10D 30/668*
(2025.01); *H10D 62/107* (2025.01); *H10D*
*62/111* (2025.01); *H10D 62/8325* (2025.01)
(58) Field of Classification Search
CPC .. H10D 30/665; H10D 30/668; H10D 62/107;
H10D 62/111; H10D 62/8325;
(Continued)

(56) References Cited

U.S. PATENT DOCUMENTS

2006/0231917 A1 10/2006 Ono et al.
2010/0032791 A1 2/2010 Hozumi et al.
(Continued)

FOREIGN PATENT DOCUMENTS

JP 2006313892 A 11/2006
JP 2007116190 A 5/2007
(Continued)

OTHER PUBLICATIONS

Office Action issued for corresponding Japanese Patent Application
No. 2022-017531 dated Oct. 28, 2025.
(Continued)

*Primary Examiner* — Shahed Ahmed
(74) *Attorney, Agent, or Firm* — Rabin & Berdo, P.C.

(57) ABSTRACT

A silicon carbide semiconductor device, including a semi-
conductor substrate having an active region and a termina-
tion region that surrounds the active region in a top view, a
first parallel pn layer provided in the semiconductor sub-
strate in the active region, a second parallel pn layer pro-
vided in the semiconductor substrate in the termination
region, a device structure provided in the active region, a
first electrode electrically connected to the device structure,
a second electrode, a first semiconductor region selectively
provided in the termination region, and a second semicon-
ductor region provided between the second parallel pn layer
and the first semiconductor region, and in contact with the
first semiconductor region. The second parallel pn layer is
provided apart from the first semiconductor region, at a
position deeper than the first semiconductor region and
closer to an end of the semiconductor substrate than an outer
end of the first semiconductor region.

14 Claims, 17 Drawing Sheets

(58) Field of Classification Search
CPC .. H10D 12/031; H10D 62/393; H10D 62/105; H10D 62/112; H10D 62/127; H10D 62/157; H10D 62/109–111; H01L 21/0445–0495; H01L 21/02378; C01B 32/956–984
See application file for complete search history.

(56) References Cited

U.S. PATENT DOCUMENTS

| | | | |
|---|---|---|---|
| 2012/0070965 A1 | 3/2012 | Sasaki | |
| 2016/0308037 A1 | 10/2016 | Sakata | |
| 2019/0172934 A1 | 6/2019 | Lee et al. | |
| 2019/0333988 A1 | 10/2019 | Furuhashi et al. | |
| 2020/0328273 A1* | 10/2020 | Sakata | H10D 30/665 |
| 2021/0066494 A1* | 3/2021 | Han | H10D 64/111 |
| 2021/0167167 A1* | 6/2021 | Kawada | H10D 62/111 |
| 2023/0361168 A1* | 11/2023 | Han | H10D 62/393 |

FOREIGN PATENT DOCUMENTS

| | | |
|---|---|---|
| JP | 2010040973 A | 2/2010 |
| JP | 2010067737 A | 3/2010 |
| JP | 2020174170 A | 10/2020 |
| WO | 2016002963 A1 | 1/2016 |
| WO | 2018029951 A1 | 2/2018 |

OTHER PUBLICATIONS

Office Action issued for corresponding Japanese Patent Application No. 2022-017531, with English Translation, dated Mar. 17, 2026.

* cited by examiner

SILICON CARBIDE SEMICONDUCTOR DEVICE

CROSS REFERENCE TO RELATED APPLICATIONS

This application is based upon and claims the benefit of priority of the prior Japanese Patent Application No. 2022-017531, filed on Feb. 7, 2022, the entire contents of which are incorporated herein by reference.

BACKGROUND OF THE INVENTION

1. Field of the Invention

Embodiments of the invention relate to a silicon carbide semiconductor device.

2. Description of the Related Art

A semiconductor device is known that has a super junction (SJ) structure in which a drift layer is constituted by a parallel pn layer formed by disposing n-type regions and p-type regions to repeatedly alternate with one another in a direction parallel to a main surface of a substrate. The n-type region and the p-type regions configuring the parallel pn layer extend in a striped pattern in a direction parallel to a main surface of a semiconductor substrate (semiconductor chip). The n-type regions and the p-type regions configuring the parallel pn layer are provided substantially uniformly in an entire area from an active region of a center (chip center) of the semiconductor substrate to an end (chip end) of the semiconductor substrate.

A structure of a conventional silicon carbide semiconductor device having a SJ structure is described taking a metal oxide semiconductor field effect transistor (MOSFET) having an insulated gate with a 3-layer structure including a metal, an oxide film, and a semiconductor) as an example. FIG. 15 is a plan view depicting a layout when the conventional silicon carbide semiconductor device is viewed from a front side of a semiconductor substrate thereof. FIGS. 16 and 17 are cross-sectional views depicting the structure along cutting line AA-AA' and cutting line BB-BB' in FIG. 15, respectively.

A conventional silicon carbide semiconductor device 150 depicted in FIGS. 15, 16, and 17 is a vertical MOSFET with a SJ structure having a parallel pn layer 151 as a drift layer 102, and a general trench gate structure in an active region 110 of a semiconductor substrate (semiconductor chip) 140 that contains silicon carbide. The semiconductor substrate 140 has a substantially rectangular shape in a plan view. The active region 110 has a substantially rectangular shape in a plan view and is disposed in a center (the chip center) of the semiconductor substrate 140. A periphery of the active region 110 is surrounded by an edge termination region 130 with an intermediate region 120 intervening therebetween.

In the intermediate region 120, a gate wiring layer (not depicted) such as a gate runner is disposed. The edge termination region 130 is a region between the intermediate region 120 and an end of the semiconductor substrate 140 (chip end). In the edge termination region 130, a junction termination extension (JTE) structure 132 and an n⁺-type channel stopper region 134 are disposed as voltage withstanding structures. The JTE structure 132 surrounds the periphery of the active region 110 with the intermediate region 120 intervening therebetween.

The n⁺-type channel stopper region 134 is disposed apart from the JTE structure 132 but closer to the chip end than is the JTE structure 132 and reaches the end of the semiconductor substrate 140. The n⁺-type channel stopper region 134 extends along the end of the semiconductor substrate 140 and surrounds a periphery of the JTE structure 132. In FIG. 15, an inner periphery of the n⁺-type channel stopper region 134 is indicated by a dashed line 134a. The n⁺-type channel stopper region 134 is provided in an entire area from the dashed line 134a to the chip end, an outer periphery of the n⁺-type channel stopper region 134 is the end of the semiconductor substrate 140.

The parallel pn layer 151 is provided uniformly in substantially an entire area of the semiconductor substrate 140, spanning the active region 110 and the edge termination region 130. The parallel pn layer 151 is a SJ structure in which n-type regions 152 and p-type regions 153 are disposed alternating with one another repeatedly in a first direction X that is parallel to the front surface of the semiconductor substrate 140. The n-type regions 152 and the p-type regions 153 of the parallel pn layer 151 extend in a striped pattern in a second direction Y that is parallel to the front surface of the semiconductor substrate 140 and orthogonal to the first direction X. In FIG. 15, the p-type regions 153 are indicated by hatching.

The n-type regions 152 and the p-type regions 153 of the parallel pn layer 151 are disposed in substantially an entire area of the edge termination region 130, directly beneath the JTE structure 132 and the n⁺-type channel stopper region 134 (at surfaces thereof facing an n⁺-type drain region 101 (refer to FIGS. 16 and 17)). The parallel pn layer 151 is adjacent to the JTE structure 132 and the n⁺-type channel stopper region 134, in a depth direction Z along an entire periphery of the JTE structure 132 and the n⁺-type channel stopper region 134, and reaches the front surface of the semiconductor substrate 140, between the JTE structure 132 and the n⁺-type channel stopper region 134.

A cross-section of the structure of the conventional silicon carbide semiconductor device 150 is described. The semiconductor substrate 140 is formed by sequentially stacking epitaxial layers 142, 143 constituting the drift layer 102 and a p-type base region 104, on an n⁺-type starting substrate 141 that contains silicon carbide. The semiconductor substrate 140 has, as a front surface, a main surface having the p-type epitaxial layer 143 and as a back surface, a main surface having the n⁺-type starting substrate 141, which constitutes the n⁺-type drain region 101. The epitaxial layer 142 is a portion constituting the drift layer (drift region) 102 and includes the parallel pn layer 151.

A portion of the p-type epitaxial layer 143 in the edge termination region 130 is removed, thereby forming a drop 131 at the front surface of the semiconductor substrate 140. With the drop 131 as a boundary, the front surface of the semiconductor substrate 140 has a portion (hereinafter, second surface portion) 140b that is in the edge termination region 130 and recessed toward the n⁺-type drain region 101 as compared to a portion (hereinafter, first surface portion) 140a on the active region 110 side of the boundary. Reference character 140c is a portion (hereinafter, third surface portion) of the front surface of the semiconductor substrate 140, connecting the first surface portion 140a and the second surface portion 140b.

In the edge termination region 130, the n⁻-type epitaxial layer 142 is exposed at the second surface portion 140b of the front surface of the semiconductor substrate 140. In surface regions of the semiconductor substrate 140, at the second surface portion 140b of the front surface thereof, the n⁺-type channel stopper region 134 and multiple p-type regions configuring the JTE structure 132 are each selectively provided in the n⁻-type epitaxial layer 142. In FIGS. 16 and 17, the multiple p-type regions configuring the JTE structure 132, disposed adjacently to one another in a concentric pattern surrounding the periphery of the active region 110 are depicted as a single p⁻-type region 133.

The p⁻-type regions 133 of the JTE structure 132 are fixed to a potential of a source electrode (not depicted), via a p⁺-type outer peripheral region 113 that from the active region 110, extends closer to the chip end than is the drop 131. A portion of the p⁺-type outer peripheral region 113 closer to the chip end than is the drop 131, the p⁻-type regions 133 of the JTE structure 132, and the n⁺-type channel stopper region 134 are exposed at the second surface portion 140b of the front surface of the semiconductor substrate 140. Being exposed at the second surface portion 140b of the front surface of the semiconductor substrate 140 means being in contact with a field insulating film 135 on the second surface portion 140b.

The n-type regions 152 and the p-type regions 153 of the parallel pn layer 151 are disposed at equal intervals in an entire area of the semiconductor substrate 140, spanning the active region 110 and the edge termination region 130. The n-type regions 152 and the p-type regions 153 of the parallel pn layer 151 are disposed directly beneath the p⁺-type outer peripheral region 113 in the intermediate region 120 and directly beneath the p⁻-type regions 133 and the n⁺-type channel stopper region 134 in the edge termination region 130, the n-type regions 152 and the p-type regions 153 of the parallel pn layer 151 being in contact with the p⁺-type outer peripheral region 113, the p⁻-type regions 133, and the n⁺-type channel stopper region 134 in the depth direction Z.

The n-type regions 152 and the p-type regions 153 of the parallel pn layer 151 are exposed at the second surface portion 140b of the front surface of the semiconductor substrate 140, between the p⁻-type regions 133 of the JTE structure 132 and the n⁺-type channel stopper region 134. Carrier concentrations (impurity concentrations) and widths (widths in the first direction X) Wn, Wp of the n-type regions 152 and the p-type regions 153 of the parallel pn layer 151 are each set, so that charge balance is obtained by the adjacent n-type regions 152 and p-type regions 153 of the parallel pn layer 151.

Obtaining charge balance means that a charge amount expressed by a product of the carrier concentration and the width Wn of the n-type regions 152 and a charge amount expressed by a product of the carrier concentration and the width Wp of the p-type regions 153 are the same within a range that includes allowable error due to process variation. Reference character 102a is a normal n-type drift region free of the SJ structure, between the parallel pn layer 151 and the n⁺-type drain region 101. Reference numerals 114, 116, 136 are an interlayer insulating film, a drain electrode, and a passivation film, respectively.

As for a conventional silicon carbide semiconductor device with a SJ structure, a device has been proposed in which in an edge termination region, widths of n-type regions and p-type regions of a parallel pn layer are set to be relatively wide directly beneath a p⁺⁺-type outer peripheral contact region defining an outer edge of an active region and a p-type RESURF region adjacent thereto on an outer side, whereby breakdown voltage of the edge termination region is enhanced and when the MOSFET is OFF, hole current flowing through the p⁺⁺-type outer peripheral contact region and the p-type RESURF region is suppressed and dV/dt is enhanced (for example, refer to International Publication No. WO 2018/029951).

As for another conventional silicon carbide semiconductor device with a SJ structure, a device has been proposed in which, at different depth positions in a drift layer in an edge termination region, at least one p-type horizontal RESURF region is provided, surrounding a periphery of an active region and extending parallel to a front surface of a semiconductor substrate and orthogonal to n-type regions and p-type regions of a parallel pn layer (for example, refer to Japanese Laid-Open Patent Publication No. 2010-067737). In Japanese Laid-Open Patent Publication No. 2010-067737, when the MOSFET is off, due to the p-type horizontal RESURF region, a depletion layer spreads toward the chip end, whereby electric field of the edge termination region is mitigated, and predetermined breakdown voltage of the edge termination region is stably obtained.

As for another conventional silicon carbide semiconductor device with a SJ structure, a device has been proposed in which closer to a chip end than is an active region, a p-type RESURF region is selectively provided only in surface regions of n-type regions of a parallel pn layer so as not to be in p-type regions of the parallel pn layer (for example, refer to Japanese Laid-Open Patent Publication No. 2010-040973). In Japanese Laid-Open Patent Publication No. 2010-040973, the p-type RESURF regions and the p-type regions of the parallel pn layer are formed superimposed (overlapping), whereby increases in impurity concentration of the p-type regions of parallel pn layer are suppressed and deviations in depletion conditions caused by overlap are avoided.

SUMMARY OF THE INVENTION

According to an embodiment of the present invention, a silicon carbide semiconductor device includes a semiconductor substrate containing silicon carbide, the semiconductor substrate having an active region and a termination region that surrounds a periphery of the active region in a top view of the silicon carbide semiconductor device, the semiconductor substrate having a first main surface and a second main surface that are opposite to each other; a first parallel pn layer provided in the semiconductor substrate in the active region, the first parallel pn layer having disposed therein a plurality of first first-conductivity-type regions and a plurality of first second-conductivity-type regions repeatedly alternating with one another in a first direction that is parallel to the first main surface of the semiconductor substrate; a second parallel pn layer provided in the semiconductor substrate, adjacent to the first parallel pn layer and in the termination region, the second parallel pn layer having disposed therein a plurality of second first-conductivity-type regions and a plurality of second second-conductivity-type regions repeatedly alternating with one another in the first direction; a device structure provided in the active region, between the first main surface of the semiconductor substrate and the first parallel pn layer; a first electrode provided on the first main surface of the semiconductor substrate, and electrically connected to the device structure; a second electrode provided on the second main of the semiconductor substrate; a first semiconductor region of a second conductivity type, configuring a voltage withstanding structure and being electrically connected to the first electrode, the first semiconductor region being selectively provided in the termination region, between the first main surface of the semiconductor substrate and the second parallel pn layer, and surrounding the periphery of the active region, the second parallel pn layer being provided apart from the first semiconductor region, at a position deeper from the first main surface of the semiconductor substrate than is the first semiconductor region and closer to an end of the semiconductor substrate than is an outer end of the first semiconductor region; and a second semiconductor region of a first conductivity type, provided between the second parallel pn layer and the first semiconductor region, and in contact with the first semiconductor region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 8 is an enlarged view of a portion surrounded by a rectangular frame C in FIG. 7.

FIG. 11 is a cross-sectional view of the structure along cutting line D2-D3 and cutting line E2-E3 in FIG. 7.

FIG. 16 is a cross-sectional view depicting a structure along cutting line AA-AA' in FIG. 15.

DETAILED DESCRIPTION OF THE INVENTION

Figure 14:
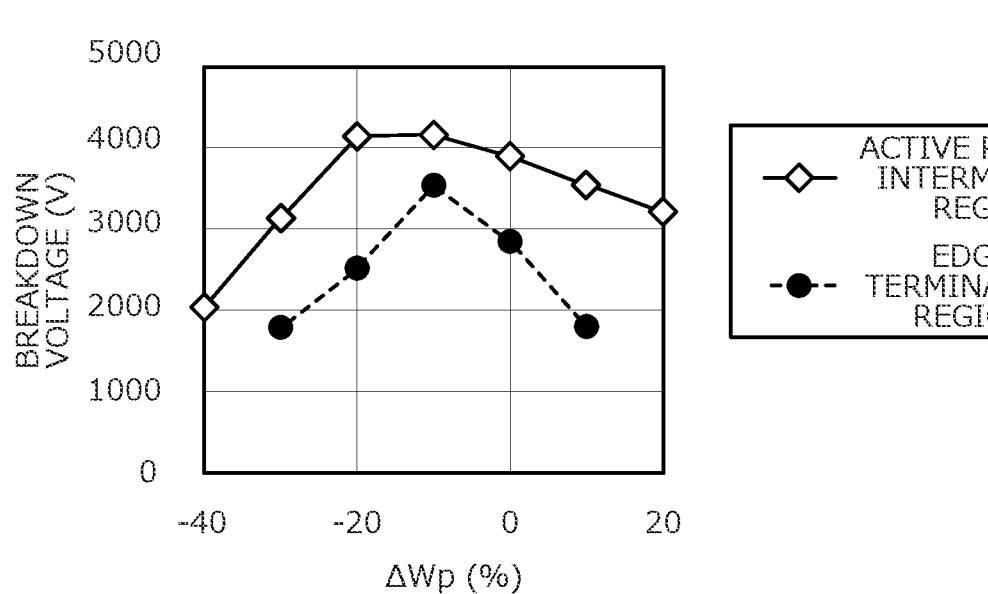
FIG. 14 is a characteristics diagram showing results of simulation of breakdown voltage characteristics of a conventional silicon carbide semiconductor device.
Figure 15:
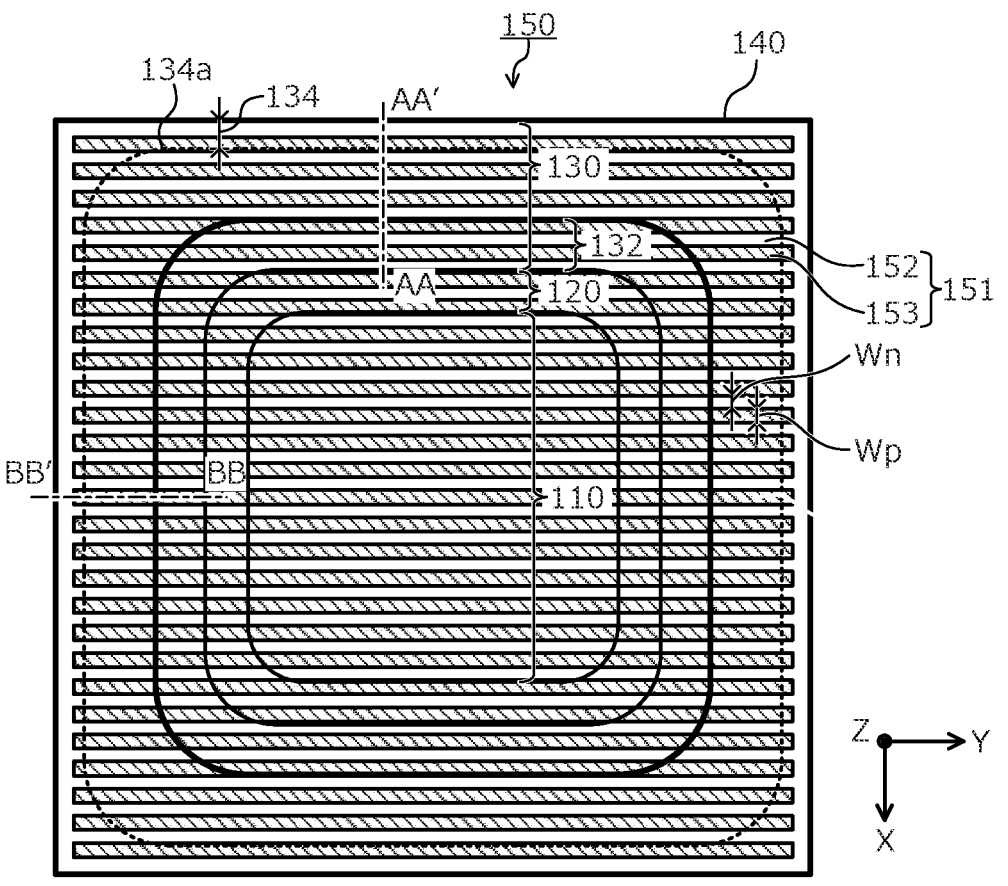
FIG. 15 is a plan view depicting a layout when the conventional silicon carbide semiconductor device is viewed from a front side of a semiconductor substrate thereof.
Figure 16:
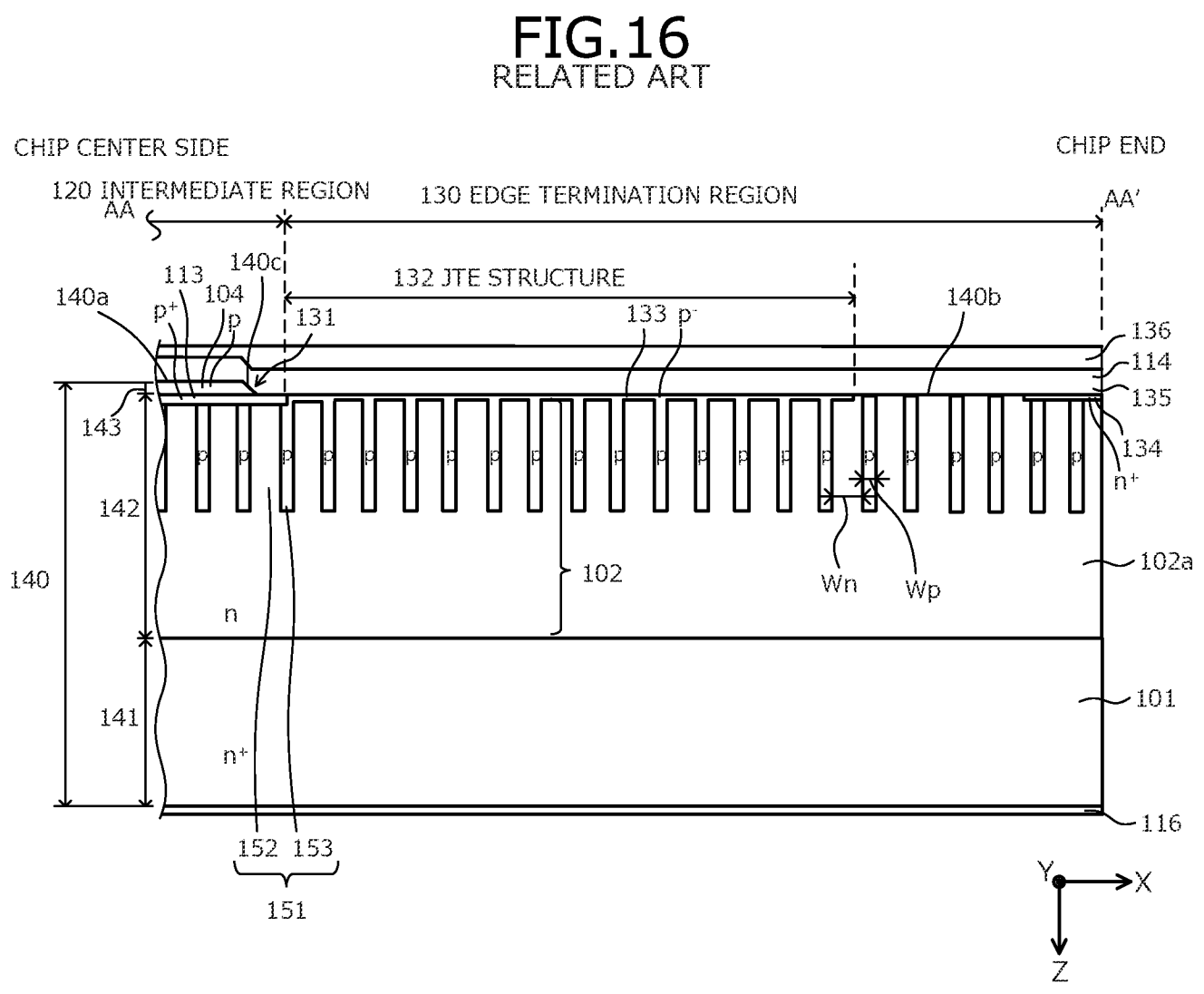
Figure 17:
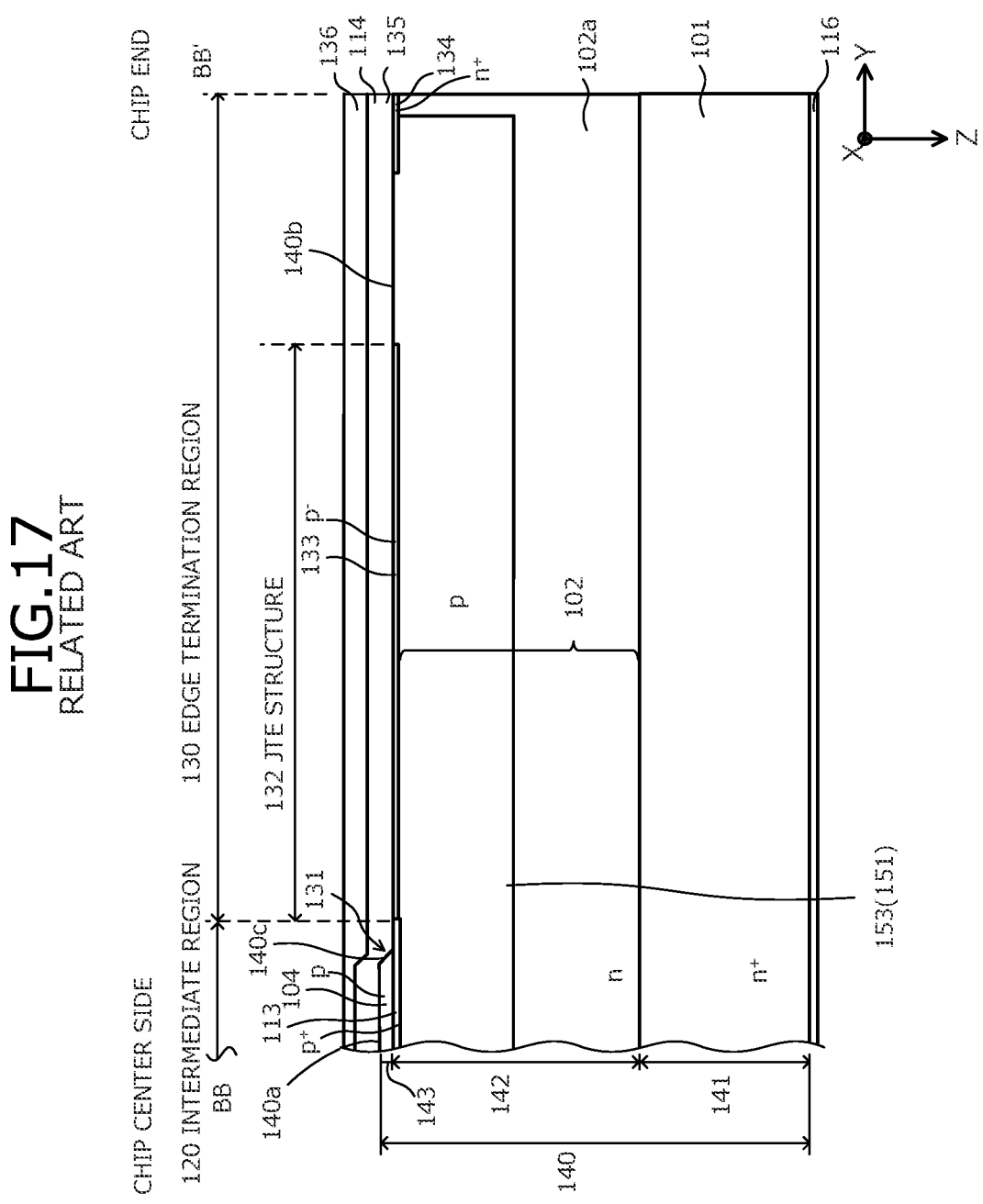
FIG. 17 is a cross-sectional view depicting the structure along cutting line BB-BB' in FIG. 15.

First, problems associated with the conventional techniques are discussed. In the conventional silicon carbide semiconductor device 150 (refer to FIGS. 15 to 17), the breakdown voltage (BV) of the edge termination region 130 is small with respect to breakdown voltages of the active region 110 and the intermediate region 120. FIG. 14 is a characteristics diagram showing results of simulation of breakdown voltage characteristics of the conventional silicon carbide semiconductor device. Breakdown voltage distribution of the active region 110 and the intermediate region 120 (active region+intermediate region) and breakdown voltage distribution of the edge termination region 130 of the conventional silicon carbide semiconductor device 150 for which the breakdown voltage is set to 3.3 kV are shown in FIG. 14.

In FIG. 14, a horizontal axis indicates a difference $\Delta Wp$ (%) from a central condition of the width of the p-type regions 153 of the parallel pn layer 151 of the edge termination region 130 and a vertical axis indicates breakdown voltage. The central condition of the width of the p-type regions 153 of the parallel pn layer 151 of the edge termination region 130 corresponds to, in FIG. 14, $\Delta Wp$=(width of the p-type regions 153 of the parallel pn layer 151 of the active region 110–width of the p-type regions 153 of the parallel pn layer 151 of the edge termination region 130)/(width of the p-type regions 153 of the parallel pn layer 151 of the active region 110)=0%, with respect to the width of the p-type regions 153 of the parallel pn layer 151 satisfying in the active region 110 "impurity concentration of the n-type regions 152×width of the n-type regions 152=impurity concentration of the p-type regions 153×width of the p-type regions 153".

An instance of $\Delta Wp < 0\%$ and an instance of $\Delta Wp > 0\%$ are instances in which with respect to the width of the p-type regions 153 of the parallel pn layer 151 of the active region 110, the width of the p-type regions 153 of the parallel pn layer 151 of the edge termination region 130 is increased and decreased, respectively. In FIG. 14, the width of the p-type regions 153 of the parallel pn layer 151 of the active region 110 is about 10% greater than the width of the p-type regions 153 of the parallel pn layer 151 of the active region 110 ($\Delta Wp$=–10%), whereby in the active region 110 and the edge termination region 130, the breakdown voltage exceeds 3.3 kV and the breakdown voltage of the edge termination region 130 becomes greatest.

As depicted in FIG. 14, it was confirmed that in the conventional silicon carbide semiconductor device 150, independent of the width of the p-type regions 153 of the parallel pn layer 151 of the active region 110, the breakdown voltage of the edge termination region 130 became less than the breakdown voltage of the active region 110 and the intermediate region 120. In the edge termination region 130, avalanche breakdown is facilitated and as compared to an instance of avalanche breakdown in an the active region 110 of a wide area (surface area) occupying a majority of the semiconductor substrate 140, overall avalanche capability and breakdown voltage of the silicon carbide semiconductor device 150 is small.

Embodiments of a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
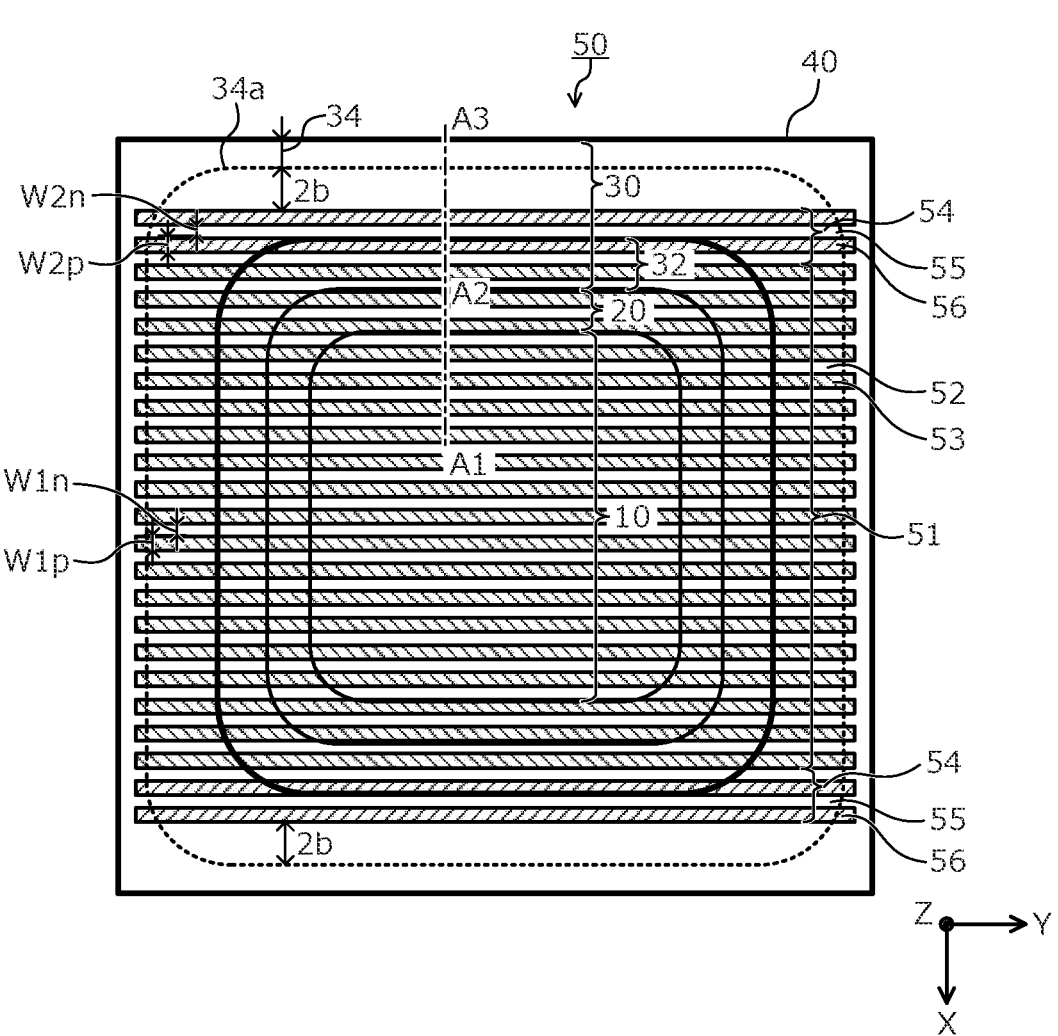
FIG. 1 is a plan view depicting a layout when a silicon carbide semiconductor device according to a first embodiment is viewed from a front side of a semiconductor substrate thereof.

A structure of a silicon carbide semiconductor device according to a first embodiment is described taking a MOSFET as an example. FIG. 1 is a plan view depicting a layout when the silicon carbide semiconductor device according to the first embodiment is viewed from a front side of a semiconductor substrate thereof. In FIG. 1, p-type regions 53, 56 of first and second parallel pn layers 51, 54 are indicated by different hatching, respectively. In FIG. 1, for example, a layout of a 3 mm²-square semiconductor substrate 40 is depicted. The number of n-type regions (first and second first-conductivity-type regions) 52, 55 and p-type regions (first and second second-conductivity-type regions) 53, 56 of the first and second parallel pn layers 51, 54 depicted in FIG. 1 is reduced for simplicity and differs from that depicted in FIGS. 2 to 4.

Figure 2:
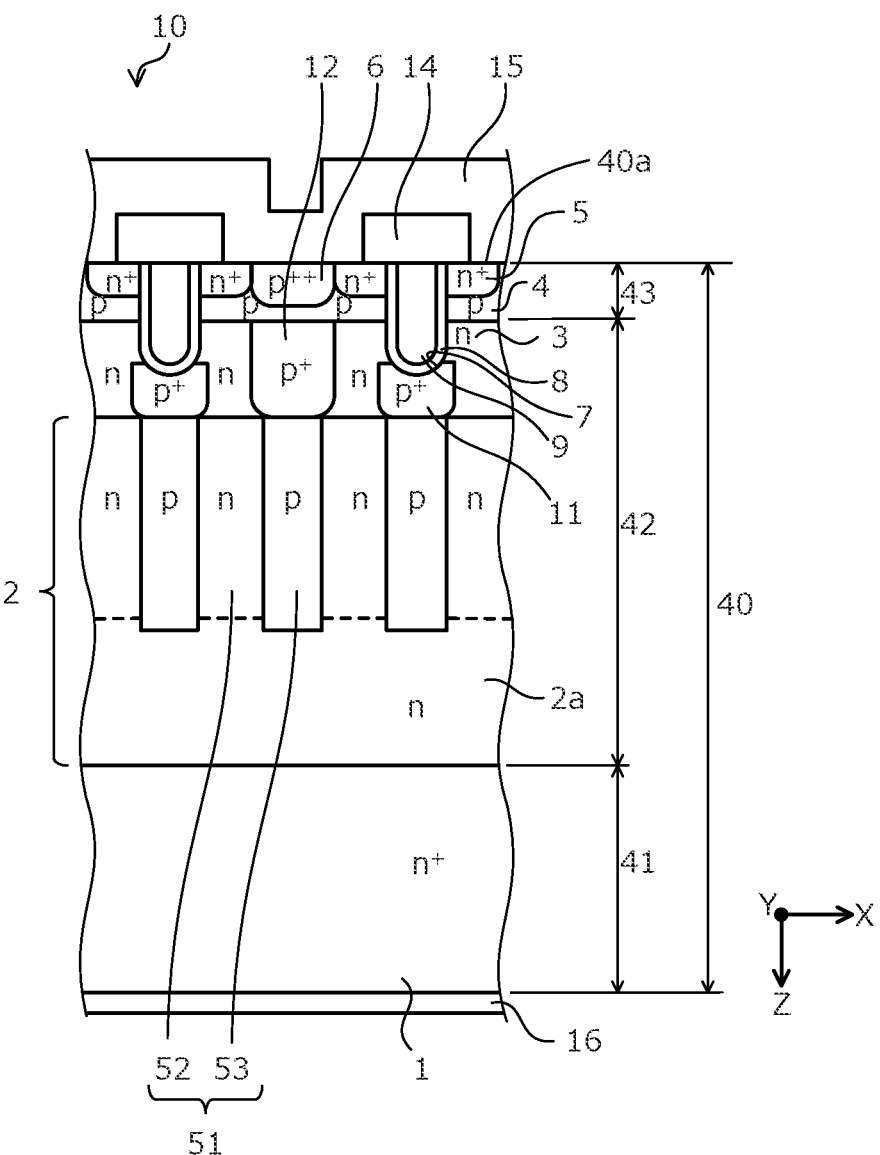
FIG. 2 is a cross-sectional view of a structure of an active region in FIG. 1.
Figure 3:
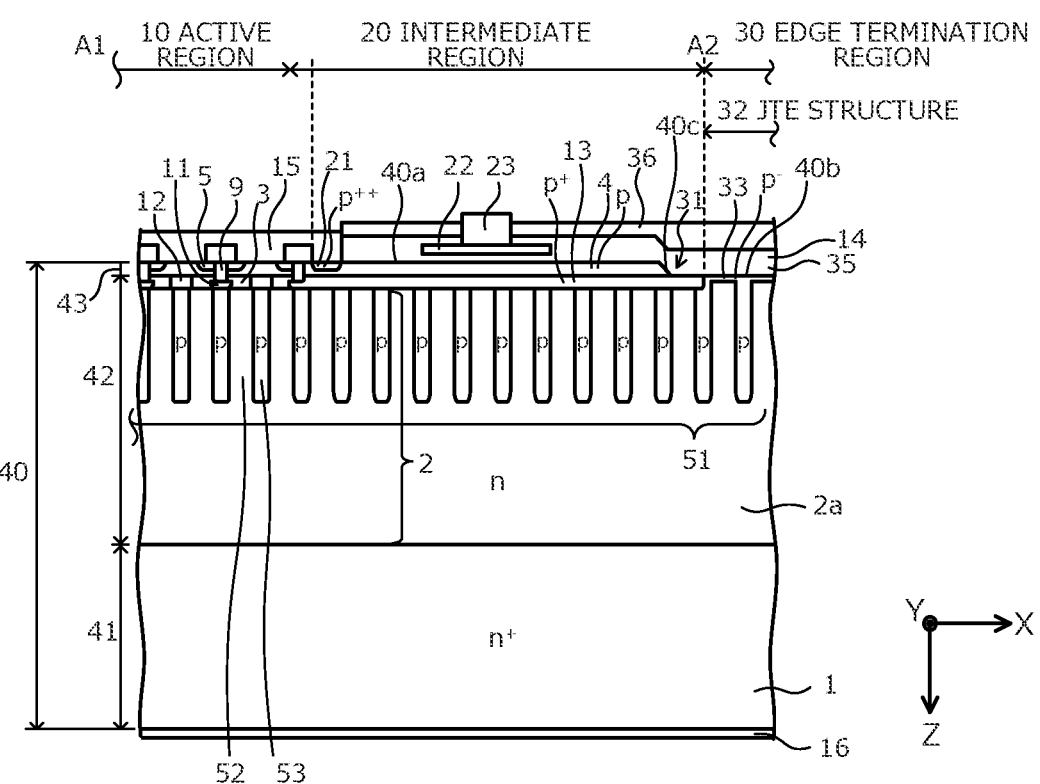
FIG. 3 is a cross-sectional view depicting the structure along cutting line A1-A2 in FIG. 1.
Figure 4:
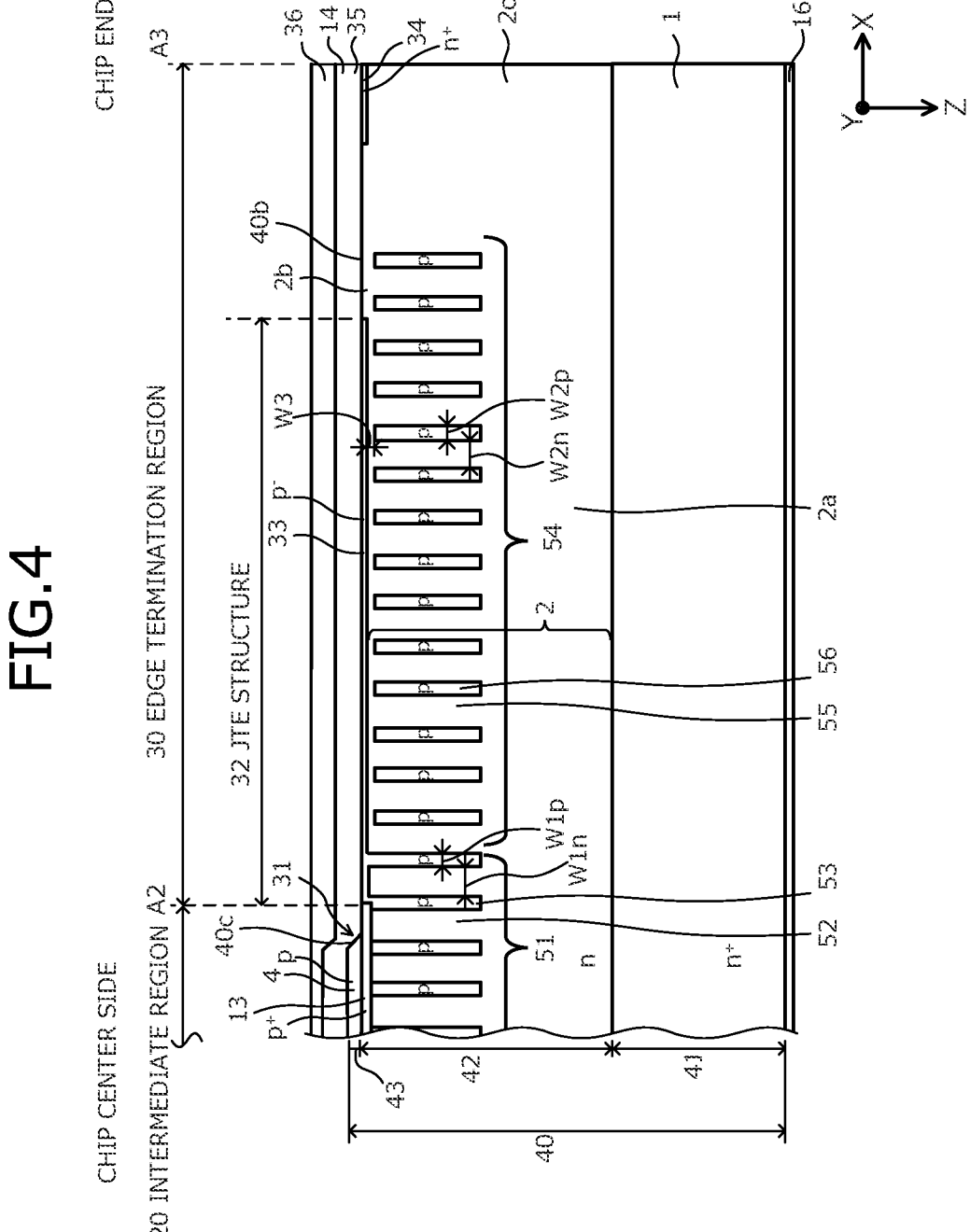
FIG. 4 is a cross-sectional view depicting the structure along cutting line A2-A3 in FIG. 1.

FIG. 2 is a cross-sectional view of the structure of an active region in FIG. 1. FIG. 2 depicts a single unit cell among multiple unit cells (configuration units of a device element) having an identical structure and disposed in an active region 10. FIGS. 3 and 4 are cross-sectional views depicting the structure along cutting line A1-A2 and cutting line A2-A3 in FIG. 1, respectively. FIG. 3 depicts an area from a border with an intermediate region 20 to a vicinity of a border between the intermediate region 20 and an edge termination region 30. FIG. 4 depicts an area from a proximity of the border between the intermediate region 20 and the edge termination region 30 to an end (chip end) of the semiconductor substrate 40.

A silicon carbide semiconductor device 50 according to the first embodiment depicted in FIGS. 1 to 4 includes the active region 10, the intermediate region 20, and the edge termination region 30 on the semiconductor substrate (semiconductor chip) 40 containing silicon carbide (SiC) and is a vertical MOSFET having a trench gate structure (device element structure) and a SJ structure in which a drift layer (drift region) 2 spans the active region 10 to the edge termination region 30 and is a parallel pn layer (the first and second parallel pn layers 51, 54). The active region 10 is a region through which a main current flows when the MOSFET is ON and is disposed in a center (the chip center) of the semiconductor substrate 40.

The intermediate region 20 is adjacent to the active region 10 and surrounds a periphery of the active region 10. The edge termination region 30 is a region between the intermediate region 20 and an end of the semiconductor substrate 40 and surrounds the periphery of the active region 10 with the intermediate region 20 intervening therebetween. The active region 10 and the intermediate region 20 are a SJ structure in which the drift layer 2 is constituted by a first parallel pn layer 51. The edge termination region 30 is a SJ structure in which the drift layer 2, at a predetermined portion thereof on an inner side (chip center side) is constituted by the first parallel pn layer 51 while a portion other than the predetermined portion constituting the first parallel pn layer 51 is constituted by a second parallel pn layer 54.

The border between the active region 10 and the intermediate region 20 is an inner end (inner periphery) of a p++-type outer peripheral contact region 21 (refer to FIG. 3) for leading out later-described minority carriers (holes). The border between the intermediate region 20 and the edge termination region 30 is an inner end (inner periphery) of a later-described JTE structure 32. The inner end of the JTE structure 32 is an inner end of an innermost p-type region of multiple p-type regions (collectively depicted as a single p⁻-type region (first semiconductor regions) 33 in FIG. 4) configuring the JTE structure 32 and is a joined portion (interface) joined to a later-described p⁺-type outer peripheral region 13 of the intermediate region 20 (refer to FIG. 4).

The edge termination region 30 has a function of mitigating electric field of a front side (side having a first main surface) of the semiconductor substrate 40, in the drift layer 2 in the active region 10 and the intermediate region 20, and a function of sustaining breakdown voltage. The breakdown voltage is a voltage limit at which leakage current does not increases excessively and malfunction and/or destruction of the device element does not occur. In the edge termination region 30, as voltage withstanding structures, the junction termination extension (JTE) structure 32 and an n⁺-type channel stopper region 34 are disposed. The JTE structure 32 surrounds the periphery of the active region 10 with the intermediate region 20 intervening therebetween.

The JTE structure 32 is a structure in which multiple p-type regions are disposed adjacent to one another in a concentric pattern surrounding the periphery of the active region 10 with the intermediate region 20 intervening therebetween, the p-type regions being disposed in descending order of impurity concentration in a direction from the active region 10 to the chip end. Due to the JTE structure 32, electric field concentration closer to the chip end than is the intermediate region 20 is mitigated and device element destruction due to application of a voltage less than a predetermined voltage (breakdown voltage of the edge termination region 30) is prevented. The JTE structure 32, for example, may be a double-zone JTE structure or a spatial modulation JTE structure.

The double-zone JTE structure is a structure in which the JTE structure is configured by 2 adjacent p-type regions (a p⁻-type region and a p⁻⁻-type region on outer peripheral side thereof). The spatial modulation JTE structure is a structure in which, between adjacent p-type regions configuring the JTE structure (or 1 p-type region and a later-described normal n⁻-type drift region (second semiconductor region) 2b on an outer peripheral side thereof (refer to FIG. 4)), a spatial modulation region having an impurity concentration distribution spatially equivalent to an intermediate impurity concentration of these two regions is disposed, and in which an impurity concentration distribution of the JTE structure overall gradually decreases in a direction from the chip center to the chip end.

The spatial modulation region is formed by repeatedly disposing two small regions alternately and adjacently to one another in a predetermined pattern, each of the two small regions having an impurity concentration that is substantially the same as that of the regions that are adjacent on both sides of the spatial modulation region (adjacent p-type regions configuring the JTE structure or a single p-type region and the normal n⁻-type drift region 2b on the outer side thereof). An overall spatial impurity concentration distribution of the spatial modulation region is determined by the widths and the impurity concentration ratio of the two small regions. The spatial modulation JTE structure may ensure more stable predetermined breakdown voltage of the edge termination region as compared to a general JTE structure without the spatial modulation region.

The n⁺-type channel stopper region 34 is disposed apart from the JTE structure 32 and closer to the chip end than is the JTE structure 32 and, for example, reaches the end of the semiconductor substrate 40 on each of the 4 sides (linear portions) of the end of the semiconductor substrate 40. The $n^+$-type channel stopper region 34 extends along the end of the semiconductor substrate 40, thereby surrounding the periphery of the JTE structure 32. In FIG. 1, the inner periphery of the $n^+$-type channel stopper region 34 is indicated by a dashed line 34a. The $n^+$-type channel stopper region 34 is provided in a region from an outer peripheral side of the dashed line 34a and an outer periphery of the $n^+$-type channel stopper region 34 is the end of the semiconductor substrate 40 that has a substantially rectangular shape in a plan view.

The first parallel pn layer 51 is a SJ structure in which n-type regions 52 and p-type regions 53 are disposed adjacent to one another, repeatedly alternating with one another in the first direction X parallel to the front surface of the semiconductor substrate 40. The n-type regions 52 and the p-type regions 53 of the first parallel pn layer 51 extend in a striped pattern in the second direction Y, which is parallel to the front surface of the semiconductor substrate 40 and orthogonal to the first direction X, for example, the n-type regions 52 and the p-type regions 53 extend to a vicinity of the end of the semiconductor substrate 40. Ends (ends in longitudinal direction of the striped pattern (the second direction Y)) of the n-type regions 52 and the p-type regions 53 of the first parallel pn layer 51 may extend to positions facing the $n^+$-type channel stopper region 34 and may be in contact with the $n^+$-type channel stopper region 34 in the depth direction Z.

Further, the first parallel pn layer 51 is disposed closer to the chip end in the first direction X than is the inner end of the JTE structure 32. Accordingly, a border between the first parallel pn layer 51 and the second parallel pn layer 54 is positioned in the edge termination region 30. The first parallel pn layer 51 has the n-type regions 52 and the p-type regions 53 that pass through the active region 10 and the intermediate region 20, and the n-type regions 52 and the p-type regions 53 that pass through only the intermediate region 20. In addition, the first parallel pn layer 51 is disposed in the edge termination region 30 so that at least one of the p-type regions 53 is disposed closer to the chip end than is the inner end of the JTE structure 32 in the first direction X, and has the n-type regions 52 and the p-type regions 53 that pass through only the edge termination region 30. Outermost in the first parallel pn layer 51 in the first direction X is one of the p-type regions 53.

The n-type regions 52 and the p-type regions 53 of the first parallel pn layer 51 are in contact with the $p^+$-type outer peripheral region 13 of the intermediate region 20 and the JTE structure 32 of the edge termination region 30, in the depth direction Z. The p-type regions 53 of the first parallel pn layer 51 are fixed to a potential of a source electrode 15 via the $p^+$-type outer peripheral region 13 and the JTE structure 32 (refer to FIGS. 2 and 3). Therefore, the p-type regions 53 of the first parallel pn layer 51 are disposed closer to the chip end in the first direction X than is the inner end of the JTE structure 32, whereby concentration of electric field at the joined portion between the $p^+$-type outer peripheral region 13 of the intermediate region 20 and the JTE structure 32 when the MOSFET is OFF may be suppressed.

Charge balance is roughly obtained by the adjacent n-type regions 52 and p-type regions 53 of the first parallel pn layer 51. Obtaining charge balance means that a charge amount expressed by a product of the width and carrier concentration (impurity concentration) of the n-type regions of the parallel pn layer and a charge amount expressed by a product of the width and the carrier concentration of the p-type regions are the same within a range that includes an allowable error due to process variation. Therefore, the respective carrier concentrations and widths (widths in the first direction X) W1$n$, W1$p$ of the n-type regions 52 and the p-type regions 53 are set so that charge balance is roughly obtained by the adjacent n-type regions 52 and p-type regions 53 of the first parallel pn layer 51.

Charge balance suffices to be roughly obtained by the adjacent n-type regions 52 and p-type regions 53 of the first parallel pn layer 51, and the respective carrier concentrations and widths W1$n$, W1$p$ of the n-type regions 52 and the p-type regions 53 of the first parallel pn layer 51 are suitably set. For example, the width W1$n$ of the n-type regions 52 and the width W1$p$ of the p-type regions 53 of the first parallel pn layer 51 may be substantially the same. In this instance, the carrier concentration of the n-type regions 52 and the carrier concentration of the p-type regions 53 may be set to substantially the same. Substantially the same width and substantially the same carrier concentration means a same width and a same carrier concentration within a respective range that includes an allowable error due to process variation.

The second parallel pn layer 54 is a SJ structure in which the n-type regions 55 and the p-type regions 56 are disposed repeatedly alternating with one another in the first direction X, which is parallel to the front surface of the semiconductor substrate 40. The n-type regions 55 and the p-type regions 56 of the second parallel pn layer 54 extend parallel to the n-type regions 52 and the p-type regions 53 of the first parallel pn layer 51, in a striped pattern in the second direction Y, for a length substantially the same as a length that the n-type regions 52 and the p-type regions 53 of the first parallel pn layer 51 extend in the second direction Y. The n-type regions 55 and the p-type regions 56 of the second parallel pn layer 54 are not in contact with the $p^-$-type regions 33 of the JTE structure 32. The p-type regions 56 of the second parallel pn layer 54 have a floating potential.

For example, in the conventional structure (refer to FIGS. 15 to 17), the p-type regions 153 of the parallel pn layer 151 are fixed to the potential of the source electrode via the $p^-$-type region 133 of the JTE structure 132, whereby when the MOSFET is OFF, the $p^-$-type region 133 of the JTE structure 132 does not easily deplete at a portion (portions facing the interlayer insulating film 114) directly above connecting portions with the p-type regions 153. On the other hand, in the first embodiment, the p-type regions 56 of the second parallel pn layer 54 are apart from the $p^-$-type regions 33 of the JTE structure 32, whereby uniform depletion of the $p^-$-type regions 33 of the JTE structure 32 when the MOSFET is OFF is facilitated and thus, the breakdown voltage of the edge termination region 30 may be enhanced as compared to the conventional structure.

The second parallel pn layer 54 is disposed only in the edge termination region 30 and is provided on both sides of the first parallel pn layer 51 adjacent thereto in the first direction X. Each second parallel pn layer 54 is disposed so that, in the first direction X, one of the n-type regions 55 thereof is adjacent to, among the p-type regions 53 of the first parallel pn layer 51, an outermost one that is closest to the chip end in the first direction X. Further, the second parallel pn layer 54 is disposed closer to the chip end in the first direction X than is an outer end of the JTE structure 32 facing the chip end in the first direction X, so that at least one of the p-type regions 56 is disposed closer to the chip end than is the outer end (outer periphery) of the JTE structure 32 in the first direction X.

At least one of the p-type regions 56 of the second parallel pn layer 54 is disposed closer to the chip end than is the outer end of the JTE structure 32 in the first direction X, whereby concentration of electric field at the outer end of the JTE structure 32 when the MOSFET is OFF may be suppressed. The outer end of the JTE structure 32 is the outer end of an outermost one of the multiple p-type regions that configure the JTE structure 32. Further, the second parallel pn layer 54 may be disposed to a range of, for example, about 10 μm at most from the outer end of the JTE structure 32 in the first direction X.

The range in which the second parallel pn layer 54 is disposed is set as the above range from the outer end of the JTE structure 32 in the first direction X, whereby the number of the floating p-type regions 56 disposed in the edge termination region 30 is reduced. As a result, the amount stored charge of remaining minority carriers (holes) due to MOSFET switching, etc. and accumulated in the edge termination region 30 without being discharged externally may be reduced. Therefore, a fewer number of the p-type regions 56 disposed closer to the chip end than is the outer end of the JTE structure 32 in the first direction X is favorable.

Provided the second parallel pn layer 54 is within the above range from the outer end of the JTE structure 32 in the first direction X, the second parallel pn layer 54 may be disposed directly beneath (side facing an $n^+$-type drain region 1) the $n^+$-type channel stopper region 34 in the first direction X. Between the second parallel pn layer 54 and the end of the semiconductor substrate 40 in the first direction X, a later-described normal $n^-$-type drift region $2c$ (refer to FIG. 4) may be disposed. The size of the semiconductor substrate 40 may be reduced by omitting the normal $n^-$-type drift region $2c$ or by reducing a width of the normal $n^-$-type drift region $2c$.

The adjacent n-type regions 55 and p-type regions 56 of the second parallel pn layer 54 roughly obtain charge balance. Respective carrier concentrations and widths (widths in the first direction X) $W2n$, $W2p$ of the n-type regions 55 and the p-type regions 56 are set so that rough charge balance is obtained by the adjacent n-type regions 55 and p-type regions 56 of the second parallel pn layer 54. Rough charge balance suffices to be obtained by the adjacent n-type regions 55 and p-type regions 56 of the second parallel pn layer 54 and the respective carrier concentrations and the widths $W2n$, $W2p$ of the n-type regions 55 and the p-type regions 56 of the second parallel pn layer 54 are suitably set.

For example, the width $W2n$ of the n-type regions 55 and the width $W2p$ of the p-type regions 56 of the second parallel pn layer 54 may be substantially the same. In this instance, the carrier concentration of the n-type regions 55 and the carrier concentration of the p-type regions 56 suffice to be set to be substantially the same. The width $W2p$ of the p-type regions 56 of the second parallel pn layer 54 may be wider than the width $W1p$ of the p-type regions 53 of the first parallel pn layer 51 by, for example, about 20% or less (refer to range G1 in FIG. 13) or may be preferentially wider than the width $W1p$ of the p-type regions 53 of the first parallel pn layer 51 by, for example, by about 5% to 15% (refer to range G2 in FIG. 13).

By increasing the width $W2p$ of the p-type regions 56 of the second parallel pn layer 54 within the ranges above, the breakdown voltage of the edge termination region 30 may be enhanced compared to an instance in which the widths $W1p$, $W2p$ of the p-type regions 53, 56 of the first and second parallel pn layers 51, 54 are equal. More preferably, for example, the width $W2p$ of the p-type regions 56 of the second parallel pn layer 54 may be set to be, for example, about 10% wider than the width $W1p$ of the p-type regions 53 of the first parallel pn layer 51, whereby the breakdown voltage of the edge termination region 30 may be enhanced to about the breakdown voltage of the active region 10 (refer to FIG. 13).

A cross-section of the structure of the silicon carbide semiconductor device 50 according to the first embodiment is described. As depicted in FIG. 2, in the active region 10, a general trench gate structure is provided in the front side of the semiconductor substrate 40. The trench gate structure is configured by a p-type base region 4, $n^+$-type source regions 5, $p^{++}$-type contact regions 6, gate trenches 7, a gate insulating film 8, and gate electrodes 9. The semiconductor substrate 40 is formed by sequentially stacking epitaxial layers 42, 43 constituting the drift layer 2 and the p-type base region 4 on a front surface of an $n^+$-type starting substrate 41 that contains silicon carbide.

The semiconductor substrate 40 has, as a front surface, a main surface (first main surface) with the p-type epitaxial layer 4 and as a back surface, a main surface (second main surface) having the $n^+$-type starting substrate 41. The $n^+$-type starting substrate 41 constitutes the $n^+$-type drain region 1. A portion of the p-type epitaxial layer 43 in the edge termination region 30 is removed by etching, thereby forming a step 31 at the front surface of the semiconductor substrate 40. With the step 31 as a border, the front surface of the semiconductor substrate 40 has a portion (first surface portion) $40a$ on the active region 10 side and a portion (second surface portion) $40b$ on the edge termination region 30 side, the second surface portion $40b$ being recessed toward the $n^+$-type drain region 1 compared to the first surface portion $40a$.

The second surface portion $40b$ of the front surface of the semiconductor substrate 40 is an exposed surface of the $n^-$-type the epitaxial layer 42, exposed by the removal of the p-type epitaxial layer 43. Device elements of the active region 10 and the intermediate region 20 are separated from those of the edge termination region 30 by a portion (third surface portion, mesa edge of the step 31) $40c$ connecting the first surface portion $40a$ and the second surface portion $40b$ of the front surface of the semiconductor substrate 40. The gate trenches 7 penetrate through the p-type epitaxial layer 43 from the first surface portion $40a$ of the front surface of the semiconductor substrate 40 in the depth direction Z and terminate in the $n^-$-type the epitaxial layer 42.

The gate trenches 7, for example, extend in a striped pattern in a direction (herein, the second direction Y) parallel to the front surface of the semiconductor substrate 40. The gate electrodes 9 are provided in the gate trenches 7, via the gate insulating film 8. The p-type base region 4, the $n^+$-type source regions 5, and the $p^{++}$-type contact regions 6 are selectively provided between each adjacent two of the gate trenches 7. The p-type base region 4 is a portion of the p-type epitaxial layer 43 excluding the $n^+$-type source regions 5 and the $p^{++}$-type contact regions 6.

The p-type base region 4 extends outward from the active region 10 toward the chip end and reaches the third surface portion $40c$ of the front surface of the semiconductor substrate 40. The $n^+$-type source regions 5 and the $p^{++}$-type contact regions 6 are selectively provided between the first surface portion $40a$ of the front surface of the semiconductor substrate 40 and the p-type base region 4, are in contact with the p-type base region 4 and exposed at the first surface portion 40a of the front surface of the semiconductor substrate 40. Being exposed at the first surface portion 40a of the front surface of the semiconductor substrate 40 means being in contact with the source electrode 15 in contact holes of the interlayer insulating film 14.

The p$^{++}$-type contact regions 6 are disposed further from the gate trenches 7 than are the n$^+$-type source regions 5. A portion of the n$^-$-type the epitaxial layer 42 excluding a later-described n-type current spreading region 3, p$^+$-type regions 11, 12, the p$^+$-type outer peripheral region 13, the p$^-$-type regions 33, and the n$^+$-type channel stopper region 34 constitutes the drift layer 2 that functions as a drift region of the MOSFET and includes the first and second parallel pn layers 51, 54. A portion of the drift layer 2 between the n$^+$-type starting substrate 41 and the first and second parallel pn layers 51, 54 may be a normal n-type drift region 2a free of the SJ structure.

The first and second parallel pn layers 51, 54 are provided at the above-described predetermined positions in the n$^-$-type the epitaxial layer 42. The first and second parallel pn layers 51, 54, for example, are formed by dividing epitaxial growth for forming the n$^-$-type the epitaxial layer 42 that constitutes the drift layer 2 into multiple stages and using this multi-stage epitaxial method to selectively form regions constituting the n-type regions 52, 55 and the p-type regions 53, 56 by performing ion implantation for each stage of the epitaxial growth so that regions of the same conductivity type are formed in the n$^-$-type the epitaxial layer 42, adjacent to one another in the depth direction Z.

The first parallel pn layer 51 and the second parallel pn layer 54 are a mutually different depths from the second surface portion 40b of the front surface of the semiconductor substrate 40. Therefore, in concurrently forming the first and second parallel pn layers 51, 54 by the multi-stage epitaxial method, in the uppermost stage (or the uppermost first and second stages) of the n$^-$-type the epitaxial layer 42 constituting the drift layer 2 formed by the epitaxial growth divided into multiple stages, the first parallel pn layer 51 alone is formed while in a portion directly above the second parallel pn layer 54, a portion of the n$^-$-type epitaxial layer 42 suffices to be left free of ion implantation.

Further, the first and second parallel pn layers 51, 54, for example, may be formed by forming trenches (hereinafter, SJ trenches) in an n-type epitaxial layer and leaving portions constituting the n-type regions 52, 55, and using an epitaxial method of embedding a p-type epitaxial layer constituting the p-type regions 53, 56 in the SJ trenches. In concurrently forming the first and second parallel pn layers 51, 54 by the method of embedding an epitaxial layer in the trenches, the epitaxial method for forming the n-type epitaxial layer constituting the n-type regions 52, 55 suffices to be divided into multi-stage epitaxial growth having two stages.

For example, in concurrently forming the first and second parallel pn layers 51, 54 by the method of embedding an epitaxial layer in the trenches, the n-type epitaxial layer constituting the n-type regions 52, 55 is divided into multi-stage epitaxial growth having two stages. In this instance, in a first-stage n-type epitaxial layer, the SJ trenches embedded with the p-type regions 53, 56 suffice to be formed. In a second-stage n-type epitaxial layer, the SJ trenches embedded with the p-type regions 53 suffice to be formed while the portion of the n$^-$-type the epitaxial layer 42 directly above the second parallel pn layer 54 suffices to be free of the SJ trenches.

In the active region 10, between the p-type base region 4 and the first parallel pn layer 51 (the drift layer 2), the n-type current spreading region 3 and the p$^+$-type regions 11, 12 are selectively formed. The n-type current spreading region 3 and the p$^+$-type regions 11, 12, for example, are diffused regions formed in the n$^-$-type the epitaxial layer 42 by ion implantation. The n-type current spreading region 3 and the p$^+$-type regions 11, 12 are disposed closer to the n$^+$-type drain region 1 than are bottoms of the gate trenches 7 and extend linearly parallel to the gate trenches 7 in the second direction Y.

The n-type current spreading region 3 is a so-called current spreading layer (CSL) that reduces carrier spreading resistance. Between each adjacent two of the gate trenches 7, the n-type current spreading region 3 is in contact with the p$^+$-type regions 11, 12, the p-type base region 4, and the n-type regions 52 of the first parallel pn layer 51; the n-type current spreading region 3 reaches a position closer to the n$^+$-type drain region 1 than are the bottoms of the gate trenches 7. Instead of the n-type current spreading region 3, a portion of the n$^-$-type the epitaxial layer 42 free of ion implantation may be disposed.

The p$^+$-type regions 11, 12 have a function of mitigating electric field applied to the bottoms of the gate trenches. The p$^+$-type regions 11, 12 are in contact with respectively different ones of the p-type regions 53 of the first parallel pn layer 51 in the depth direction Z. The p$^+$-type regions 11 are disposed apart from the p-type base region 4 and face the bottoms of the gate trenches 7 in the depth direction Z. Between each adjacent two of the gate trenches 7, the p$^+$-type regions 12 are in contact with the p-type base region 4 and are provided apart from the p$^+$-type regions 11 and the gate trenches 7.

The interlayer insulating film 14 covers an entire area of the front surface of the semiconductor substrate 40 except for a contact portion of the active region 10 and a later-described outer peripheral contact portion of the intermediate region 20. The contact portion of the active region 10 is an ohmic contact portion between the source electrode 15, the n$^+$-type source regions 5, and the p$^{++}$-type contact regions 6. The outer peripheral contact portion of the intermediate region 20 is an ohmic contact portion between the source electrode 15 and the later-described p$^{++}$-type outer peripheral contact region 21 (in an instance in which the p$^{++}$-type outer peripheral contact region 21 is omitted, the p-type base region 4).

In the intermediate region 20, in the front side of the semiconductor substrate 40, the p-type base region 4 and an outermost one (hereinafter, the p$^+$-type outer peripheral region 13) of the p$^+$-type regions 11 facing the bottom of an outermost one of the gate trenches 7 extend in the first direction X, from the active region 10. The p-type base region 4 in the intermediate region 20 surrounds the periphery of the active region 10. In the intermediate region 20, between the first surface portion 40a of the front surface of the semiconductor substrate 40 and the p-type base region 4, a p$^{++}$-type contact region (hereinafter, the p$^{++}$-type outer peripheral contact region 21) is selectively provided.

The p$^{++}$-type outer peripheral contact region 21 is an outer peripheral contact portion in contact with the source electrode 15 and, via the p$^+$-type outer peripheral region 13 and the p-type base region 4 when the MOSFET is OFF, leads out to the source electrode 15, minority carriers (holes) accumulated in the edge termination region 30 due to switching, etc. of the MOSFET. The p$^{++}$-type outer peripheral contact region 21 surrounds the periphery of the active region 10. The p$^{++}$-type outer peripheral contact region 21 is in ohmic contact with a portion of the source electrode 15 extending into the intermediate region.

The p$^+$-type outer peripheral region 13 extends along the border between the active region 10 and the intermediate region 20 and surrounds the periphery of the active region 10. Ends of all the p$^+$-type regions 11, 12 of the active region 10 are connected to the p$^+$-type outer peripheral region 13. Further, the p$^+$-type outer peripheral region 13 extends closer to the chip end than is the step 31 of the front surface of the semiconductor substrate 40 and is exposed at the second surface portion 40b of the front surface of the semiconductor substrate 40. Being exposed at the second surface portion 40b of the front surface of the semiconductor substrate 40 means being in contact with a later-described field oxide film 35 on the second surface portion 40b.

In the intermediate region 20 and the edge termination region 30, an insulating layer in which the field oxide film 35 and the interlayer insulating film 14 are sequentially stacked is provided on the front surface of the semiconductor substrate 40, in an entire area closer to the chip end than is the p$^{++}$-type outer peripheral contact region 21. In the intermediate region 20, a polysilicon (poly-Si) layer 22 constituting a gate runner electrically connected to the gate electrodes 9 and a gate pad (not depicted), and a metal wiring layer 23 are sequentially stacked on the field oxide film 35, closer to the chip end than is the p$^{++}$-type outer peripheral contact region 21.

In the n$^-$-type epitaxial layer 42, in surface regions thereof at the second surface portion 40b of the front surface of the semiconductor substrate 40, multiple p-type regions configuring the JTE structure 32 are selectively provided, and the n$^+$-type channel stopper region 34 is selectively provided apart from the JTE structure 32 and closer to the chip end than is the JTE structure 32. An innermost one of the p-type regions configuring the JTE structure 32 is in contact with the p$^+$-type outer peripheral region 13 in a direction parallel to the front surface of the semiconductor substrate 40. The multiple p-type regions configuring the JTE structure 32 are fixed to the potential of the source electrode 15, via the p$^+$-type outer peripheral region 13.

Between the JTE structure 32 and the n$^+$-type channel stopper region 34, is the normal n$^-$-type drift region 2b that is free of the SJ structure. The multiple p-type regions configuring the JTE structure 32 (the p$^-$-type regions 33) and the n$^+$-type channel stopper region 34 are diffused regions formed by ion implantation to the n$^-$-type the epitaxial layer 42 and are exposed at the second surface portion 40b of the front surface of the semiconductor substrate 40. The normal n$^-$-type drift region 2b is a portion left free of ion implantation in a surface region of the n$^-$-type the epitaxial layer 42 and is exposed at the second surface portion 40b of the front surface of the semiconductor substrate 40.

The n-type regions 52 and the p-type regions 53 of the first parallel pn layer 51 are adjacent to the p$^+$-type outer peripheral region 13 in the depth direction Z in the intermediate region 20 and are adjacent to the p$^-$-type regions 33 of the JTE structure 32 in the depth direction Z in the edge termination region 30. The n-type regions 55 and the p-type regions 56 of the second parallel pn layer 54 face the p$^-$-type regions 33 of the JTE structure 32 in the depth direction Z. The n-type regions 55 and the p-type regions 56 of the second parallel pn layer 54 are disposed at positions deeper from the second surface portion 40b of the front surface of the semiconductor substrate 40 than are the p$^-$-type regions 33 of the JTE structure 32 and the n$^+$-type channel stopper region 34 and are apart from these regions.

The normal n$^-$-type drift region 2b that is free of the SJ structure is between the second parallel pn layer 54 and the p$^-$-type regions 33 of the JTE structure 32. An interval W3 between the second parallel pn layer 54 and the p$^-$-type regions 33 of the JTE structure 32, for example, is in a range of about 0.5 μm to 1.5 μm. The normal n$^-$-type drift region 2c that is free of the SJ structure may be disposed between the second parallel pn layer 54 and the end of the semiconductor substrate 40. The normal n$^-$-type drift region 2c is a portion of the n$^-$-type the epitaxial layer 42, that is between the second parallel pn layer 54 and the end of the semiconductor substrate 40 and that remains free of ion implantation.

The second and third surface portions 40b, 40c of the front surface of the semiconductor substrate 40, as described above, are covered by the insulating layer in which the field oxide film 35 and the interlayer insulating film 14 are sequentially stacked. A passivation film 36 covers an entire area of the front surface of the semiconductor substrate 40 and protects the front surface of the semiconductor substrate 40. A portion of the source electrode 15 exposed by an opening in the passivation film 36 functions as a the source pad. A drain electrode (second electrode) 16 is provided in an entire area of the back surface (back surface of the n$^+$-type starting substrate 41) of the semiconductor substrate 40.

Next, a method of manufacturing the silicon carbide semiconductor device 50 according to the first embodiment is described. First, on the front surface of the n$^+$-type starting substrate (semiconductor wafer) 41 constituting the n$^+$-type drain region 1, the drift layer 2 including the first and second parallel pn layers 51, 54 is formed. For example, in an instance in which the multi-stage epitaxial method is used, epitaxial growth for forming the n$^-$-type the epitaxial layer 42 constituting the drift layer 2 is divided into multiple stages (for example, 9 stages) and for each stage, regions constituting the n-type regions 52, 55 and the p-type regions 53, 56 are each selectively formed by ion implantation so that regions of the same conductivity type are formed adjacent to one another in the depth direction Z in the n$^-$-type the epitaxial layer 42.

In the uppermost stage (or the uppermost first and second stages (for example, the 9th stage or the 8th and 9th stages)) of the n$^-$-type the epitaxial layer 42 formed by the epitaxial growth divided into multiple stages, the first parallel pn layer 51 alone is formed while in a portion directly above the second parallel pn layer 54, a portion of the n$^-$-type the epitaxial layer 42 is left free of ion implantation. As a result, the first parallel pn layer 51 is exposed at the surface of the n$^-$-type the epitaxial layer 42 while the second parallel pn layer 54 is not exposed at the surface of the n$^-$-type the epitaxial layer 42. Therefore, the first and second parallel pn layers 51, 54 at differing depths from the second surface portion 40b of the front surface of the semiconductor substrate 40 formed by subsequent processes may be formed.

Further, the n-type current spreading region 3, the p$^+$-type regions 11, 12, and the p$^+$-type outer peripheral region 13 are formed in surface regions of the first parallel pn layer 51 by ion implantation. In the active region 10 and intermediate region, the n-type current spreading region 3, the p$^+$-type regions 11, 12, and the p$^+$-type outer peripheral region 13 may be formed without forming the first parallel pn layer 51 in the uppermost stage of the n$^-$-type the epitaxial layer 42. The n-type current spreading region 3, the p$^+$-type regions 12, and the p$^+$-type outer peripheral region 13 are divided into upper and lower portions formed, respectively, in two stages of epitaxial growth of the n$^-$-type epitaxial layer 42;

the p⁺-type regions 11 may be formed concurrently with the lower portions of the p⁺-type regions 12 and the p⁺-type outer peripheral region 13.

Next, the p-type epitaxial layer 43 constituting the p-type base region 4 is epitaxially grown on the n⁻-type the epitaxial layer 42. As a result, the semiconductor substrate (semiconductor wafer) 40 is fabricated in which the epitaxial layers 42, 43 are sequentially stacked on the n⁺-type starting substrate 41 and the first and second parallel pn layers 51, 54 are included in the epitaxial layer 42. Next, a portion of the p-type epitaxial layer 43 on the edge termination region 30 side is removed by etching, whereby at the front surface of the semiconductor substrate 40, the step 31 is formed by which a portion (the second surface portion 40b) closer to the edge termination region 30 than is a portion (the first surface portion 40a) on the active region 10 side is lower than is the portion (the first surface portion 40a) on the active region 10 (refer to FIGS. 3 and 4).

In the edge termination region 30, at the newly formed second surface portion 40b of the front surface of the semiconductor substrate 40, the n⁻-type the epitaxial layer 42 is exposed. A portion (the third surface portion 40c) of the front surface of the semiconductor substrate 40 between the first surface portion 40a and the second surface portion 40b, for example, may form an obtuse angle (slope) with the first and second surface portions 40a, 40b or may form a substantially right angle (vertical face) therewith. The p-type base region 4 and the p⁺-type outer peripheral region 13 are exposed at the second and third surface portions 40b, 40c of the front surface of the semiconductor substrate 40. The p-type epitaxial layer 43 and the n⁻-type the epitaxial layer 42 may be slightly removed by the etching for forming step 31.

Next, by ion implantation, the n⁺-type source regions 5, the p⁺⁺-type contact regions 6, the p⁻-type outer peripheral contact region 21, the multiple p-type regions (the p⁻-type regions 33) of the JTE structure 32, and the n⁺-type channel stopper region 34 are selectively formed. The n⁺-type source regions 5, the p⁺⁺-type contact regions 6, and the p⁺⁺-type outer peripheral contact region 21 are each formed in surface regions of the p-type epitaxial layer 43. A portion of the p-type epitaxial layer 43 excluding the n⁺-type source regions 5, the p⁺⁺-type contact regions 6, and the p⁺⁺-type outer peripheral contact region 21 constitutes the p-type base region 4.

The p⁻-type regions 33 of the JTE structure 32 and the n⁺-type channel stopper region 34 are each selectively formed in surface regions of the n⁻-type the epitaxial layer 42 that is exposed at the second surface portion 40b of the front surface of the semiconductor substrate 40 in the edge termination region 30. A sequence in which the n⁺-type source regions 5, the p⁺⁺-type contact regions 6, the p⁺⁺-type outer peripheral contact region 21, the multiple p-type regions (the p⁻-type regions 33) of the JTE structure 32, and the n⁺-type channel stopper region 34 are formed may be interchanged. Before the step 31 is formed, the n⁺-type source regions 5, the p⁺⁺-type contact regions 6, and the p⁺⁺-type outer peripheral contact region 21 may be formed.

Next, a heat treatment (hereinafter, activation annealing) for activating the impurities ion-implanted in the epitaxial layers 42, 43 is performed. Next, the gate trenches 7 that penetrate through the n⁺-type source regions 5 and the p-type base region 4 from the front surface of the semiconductor substrate 40 and in the n-type current spreading region 3, face the p⁺-type regions 11 are formed. Next, along the front surface of the semiconductor substrate 40 and inner walls of the gate trenches 7, the gate insulating film 8 is formed. Next, a polysilicon layer is deposited on the front surface of the semiconductor substrate 40 so as to be embedded in the gate trenches 7 and is etched, leaving portions thereof constituting the gate electrodes 9 in the gate trenches 7.

In the intermediate region 20 and the edge termination region 30, the field oxide film 35 is formed on the front surface of the semiconductor substrate 40. In the intermediate region 20, the polysilicon layer 22 constituting the gate runner is formed on the field oxide film 35. The polysilicon layer 22 may be formed as a portion of the polysilicon layer deposited on the front surface of the semiconductor substrate 40 during formation of the gate electrodes 9. Next, the interlayer insulating film 14 is formed on an entire area of the front surface of the semiconductor substrate 40. Next, by a general method, surface electrodes (the source electrode 15, the gate pad, the metal wiring layer 23, and the drain electrode 16) are formed on the front and back surface of the semiconductor substrate 40.

Next, portions of the front surface of the semiconductor substrate 40 excluding a portion (portion constituting the source pad) of the source electrode 15, the gate pad, and the metal wiring layer 23 are covered and protected by the passivation film 36. Thereafter, the semiconductor wafer (the semiconductor substrate 40) is diced (cut) into individual chips, whereby the silicon carbide semiconductor device 50 depicted in FIGS. 1 to 4 is completed.

As described above, according to the first embodiment, the p-type regions of the second parallel pn layer of the edge termination region and the p⁻-type regions of the JTE structure are apart from one another. The normal n⁻-type drift region that is free of the SJ structure is between the second parallel pn layer and the p⁻-type regions of the JTE structure, and pn junctions between the p⁻-type regions of the JTE structure and the normal n⁻-type drift region are formed parallel to the second surface portion of the front surface of the semiconductor substrate. Due to a depletion layer that spreads from these pn junctions when the MOSFET is OFF, complete depletion up to the inside of the p⁻-type regions of the JTE structure occurs.

As a result, localized concentration of electric field in the p⁻-type regions of the JTE structure may be suppressed. Therefore, the breakdown voltage (static breakdown voltage) of the edge termination region may be enhanced as compared to the conventional structure in which all the p-type regions of the parallel pn layer of the edge termination region are in contact at portions facing the p⁻-type regions of the JTE structure. Further, by enhancing the breakdown voltage of the edge termination region, avalanche breakdown at the edge termination region may be suppressed. Thus, avalanche capability (dynamic breakdown voltage) of the edge termination region may be enhanced.

Figure 5:
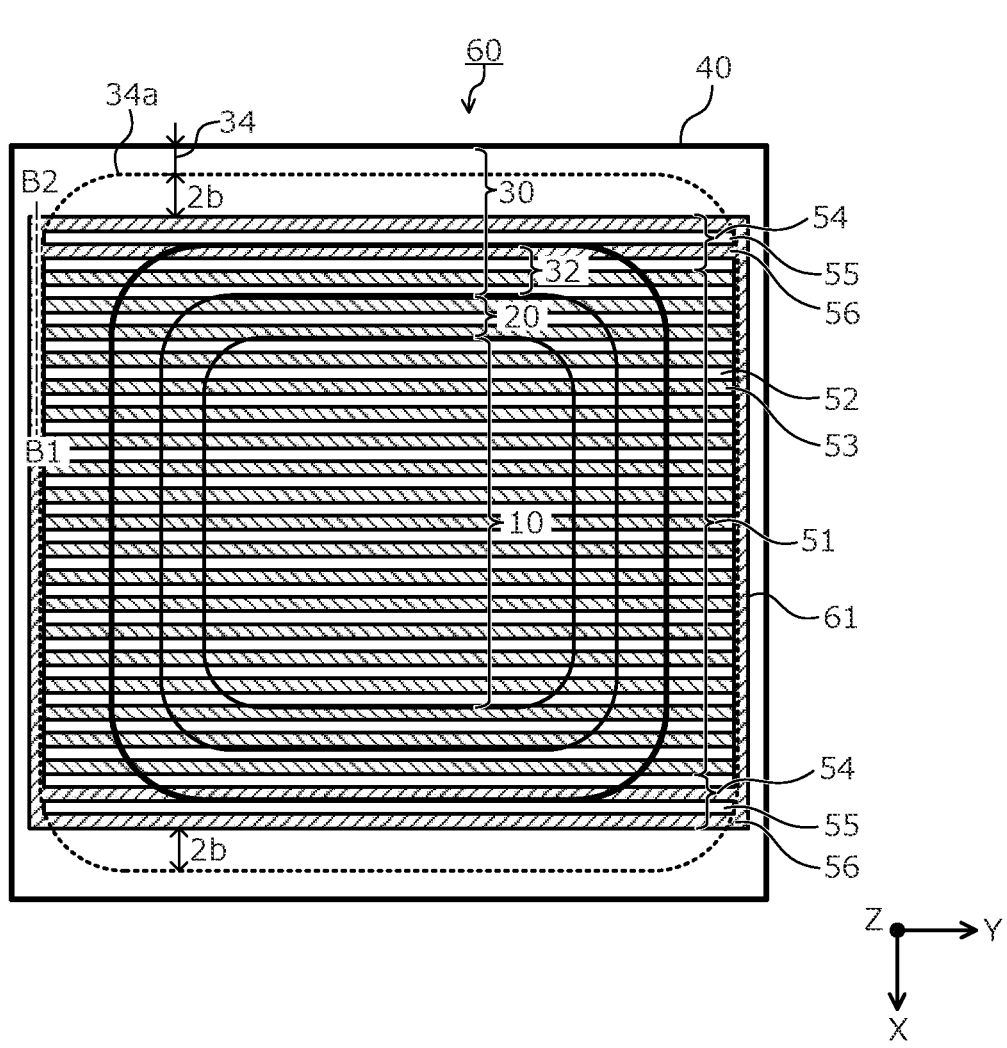
FIG. 5 is a plan view depicting a layout when a silicon carbide semiconductor device according to a second embodiment is viewed from the front side of the semiconductor substrate thereof.
Figure 6A:
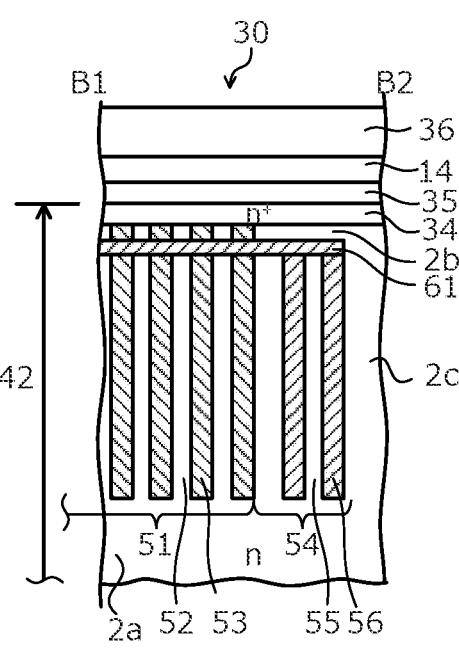
FIG. 6A is a cross-sectional view depicting a structure along cutting line B1-B2 in FIG. 5.
Figure 6B:
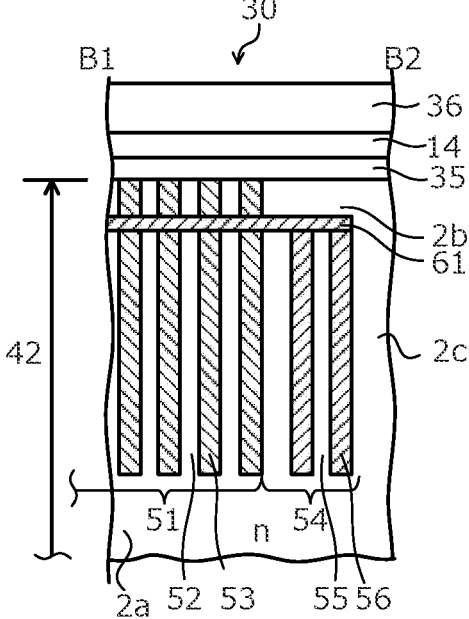
FIG. 6B is a cross-sectional view depicting a structure along cutting line B1-B2 in FIG. 5.

Next, a structure of a silicon carbide semiconductor device according to a second embodiment is described. FIG. 5 is a plan view depicting a layout when the silicon carbide semiconductor device according to the second embodiment is viewed from the front side of the semiconductor substrate thereof. FIGS. 6A and 6B are cross-sectional views depicting the structure along cutting line B1-B2 in FIG. 5. FIG. 6A depicts an instance in which a p-type connecting region (second-conductivity-type connecting region) 61 faces the n⁺-type channel stopper region 34 in the depth direction Z; FIG. 6B depicts an instance in which the p-type connecting region 61 does not face the n⁺-type channel stopper region 34 in the depth direction Z.

In FIGS. 5, 6A, and 6B, the p-type regions 56 of the second parallel pn layer 54 and the p-type connecting region 61 are indicated by hatching different from that of the p-type regions 53 of the first parallel pn layer 51. FIGS. 5, 6A, and 6B, for example, depict a layout of the semiconductor substrate 40 that is a 3 mm² square. The number of the n-type regions 52, 55 and the p-type regions 53, 56 of the first and second parallel pn layers 51, 54 depicted in FIG. 5 is reduced for simplicity. Cross-sections of the structure of the active region 10 and the intermediate region 20 of a silicon carbide semiconductor device 60 according to the second embodiment are the same as those depicted in FIGS. 2 and 3.

The silicon carbide semiconductor device 60 according to the second embodiment differs from the silicon carbide semiconductor device 50 according to the first embodiment (refer to FIGS. 1 and 4) in that ends (ends in the longitudinal direction of the striped pattern) of the p-type regions 56 of the second parallel pn layer 54 are connected to the p-type regions 53 of the first parallel pn layer 51 via the p-type connecting region 61 and are fixed to the potential of the source electrode 15 (refer to FIGS. 2 and 3). Other than the p-type connecting region 61 of the edge termination region 30, configuration of the silicon carbide semiconductor device 60 according to the second embodiment is the same as that of the silicon carbide semiconductor device 50 according to the first embodiment.

The p-type connecting region 61 is selectively formed in the n⁻-type the epitaxial layer 42, in surface regions of the semiconductor substrate 40, at the second surface portion 40b of the front surface thereof in the edge termination region 30. The p-type connecting region 61 connects all the p-type regions 56 of the second parallel pn layer 54 to the p-type regions 53 of the first parallel pn layer 51. In particular, the p-type connecting region 61, for example, connects upper ends (ends on the interlayer insulating film 14 side) of all the p-type regions 56 of the second parallel pn layer 54 to one another, extends to and is in contact with the p-type regions 53 of the first parallel pn layer 51.

The p-type connecting region 61, for example, extends linearly in the edge termination region 30 along edges of the semiconductor substrate 40 parallel to the first direction X so as to connect all the ends (ends in the longitudinal direction of the striped pattern) of the p-type regions 53, 56 of the first and second parallel pn layers 51, 54 to one another (FIG. 5). The p-type connecting region 61, for example, is provided on both ends of the p-type regions 53, 56 of the first and second parallel pn layers 51, 54. When viewed from the front side of the semiconductor substrate 40, the p-type regions are disposed in a lattice-like shape formed by the p-type connecting region 61 and the p-type regions 53, 56 of the first and second parallel pn layers 51, 54.

The p-type connecting region 61 is provided apart from the JTE structure 32, closer to the chip end than is the JTE structure 32. The p-type connecting region 61 is disposed at a position deeper from the second surface portion 40b of the front surface of the semiconductor substrate 40 than are the JTE structure 32 and the n⁺-type channel stopper region 34. The p-type connecting region 61 may be disposed at positions facing the n⁺-type channel stopper region 34 in the depth direction Z (FIG. 6A) or may be disposed deeper than the n⁺-type channel stopper region 34 (FIG. 6B).

A method of manufacturing the silicon carbide semiconductor device 60 according to the second embodiment may be implemented by forming the p-type connecting region 61 concurrently with the upper ends of the p-type regions 56 of the second parallel pn layer 54 when portions constituting the upper ends of the p-type regions 56 of the second parallel pn layer 54 are formed in the method of manufacturing the silicon carbide semiconductor device 50 according to the first embodiment.

As described above, according to the second embodiment, effects similar to those of the first embodiment are obtained. Further, according to the second embodiment, the p-type regions of the second parallel pn layer are electrically connected to the p-type regions of the first parallel pn layer passing through the active region, via the p-type connecting regions. As a result, minority carriers (holes) accumulated in the edge termination region when the MOSFET is ON may be discharged to the source electrode when the MOSFET is OFF, from the active region, which has a large area (surface area) occupying a majority of the semiconductor substrate, the minority carriers (holes) being discharged via the p-type regions of the first parallel pn layer.

Figure 7:
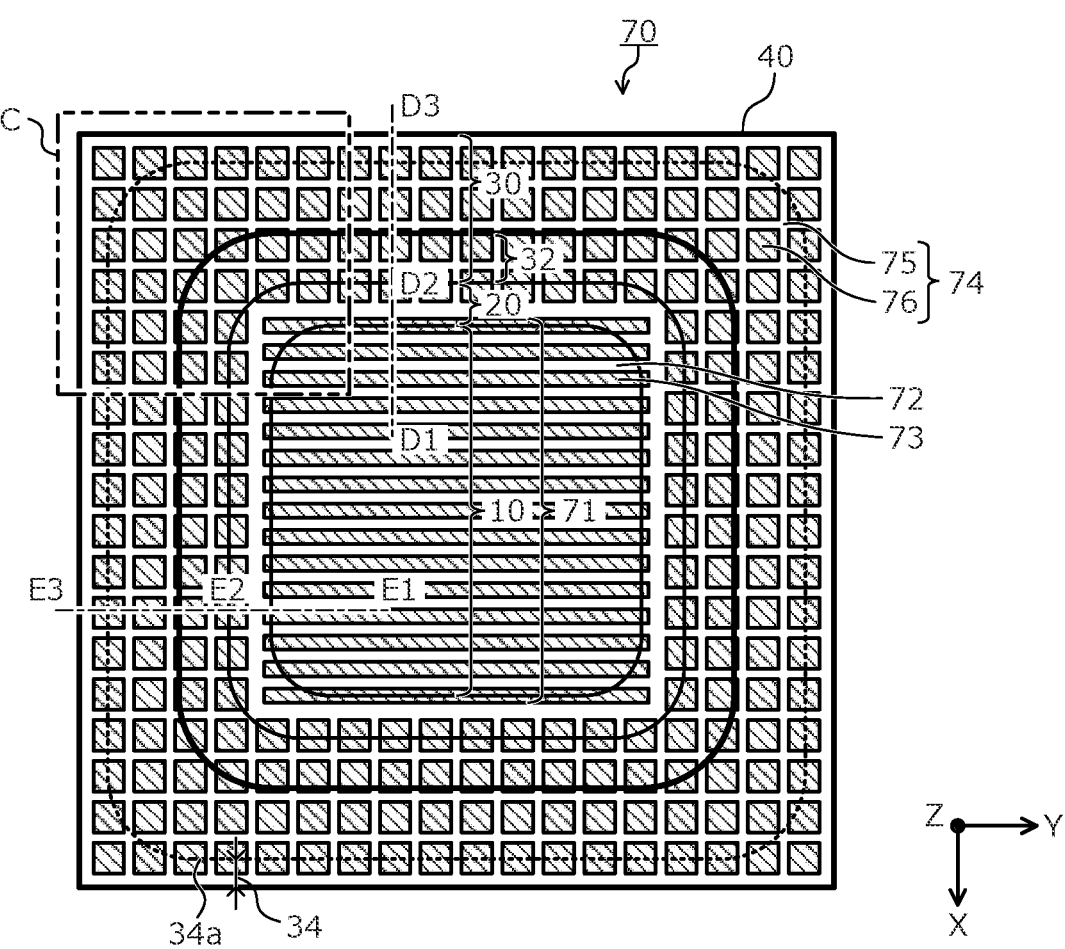
FIG. 7 is a plan view depicting a layout when a silicon carbide semiconductor device according to a third embodiment is viewed from the front side of the semiconductor substrate thereof.
Figure 8:
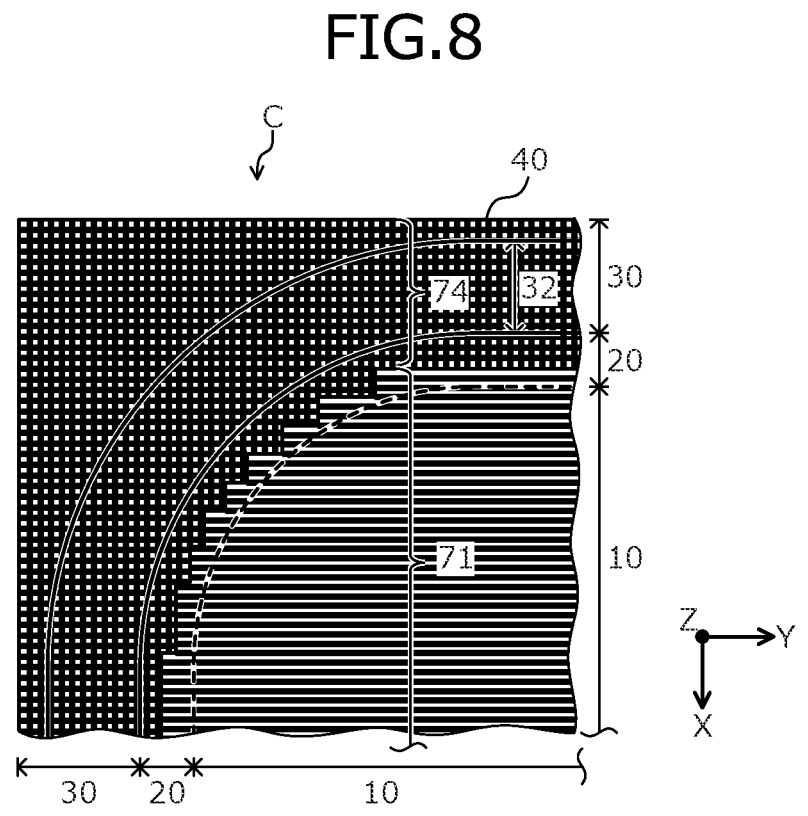
Figure 9:
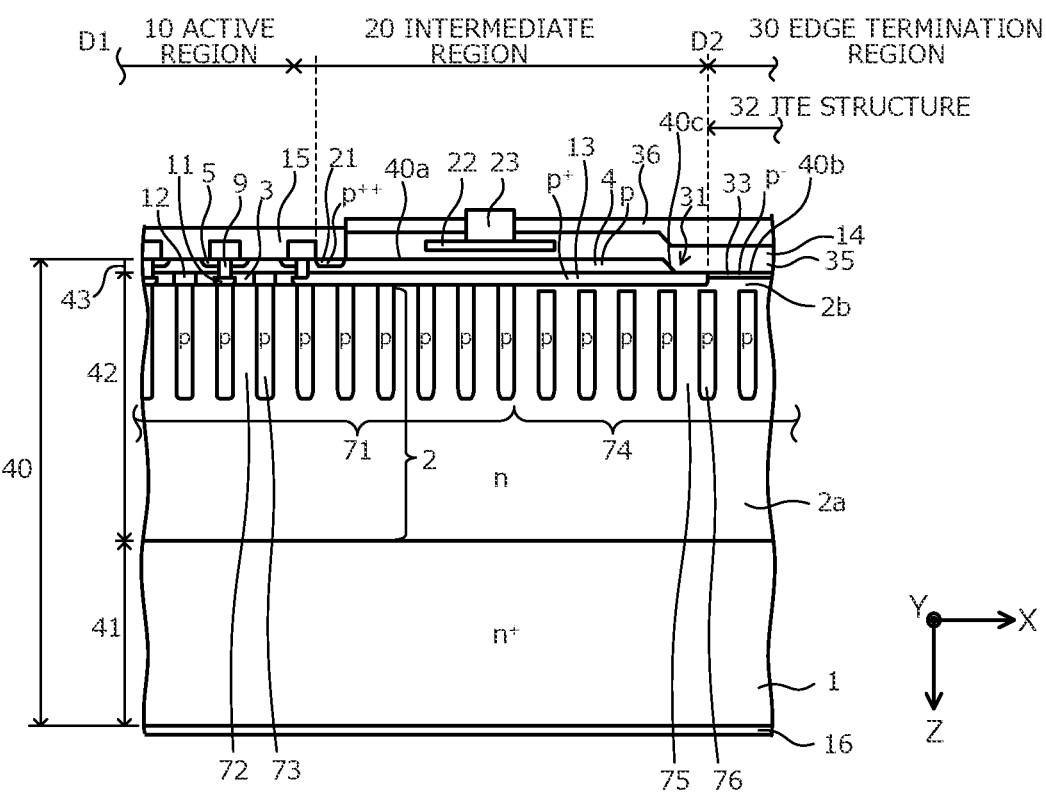
FIG. 9 is a cross-sectional view of a structure along cutting line D1-D2 in FIG. 7.
Figure 10:
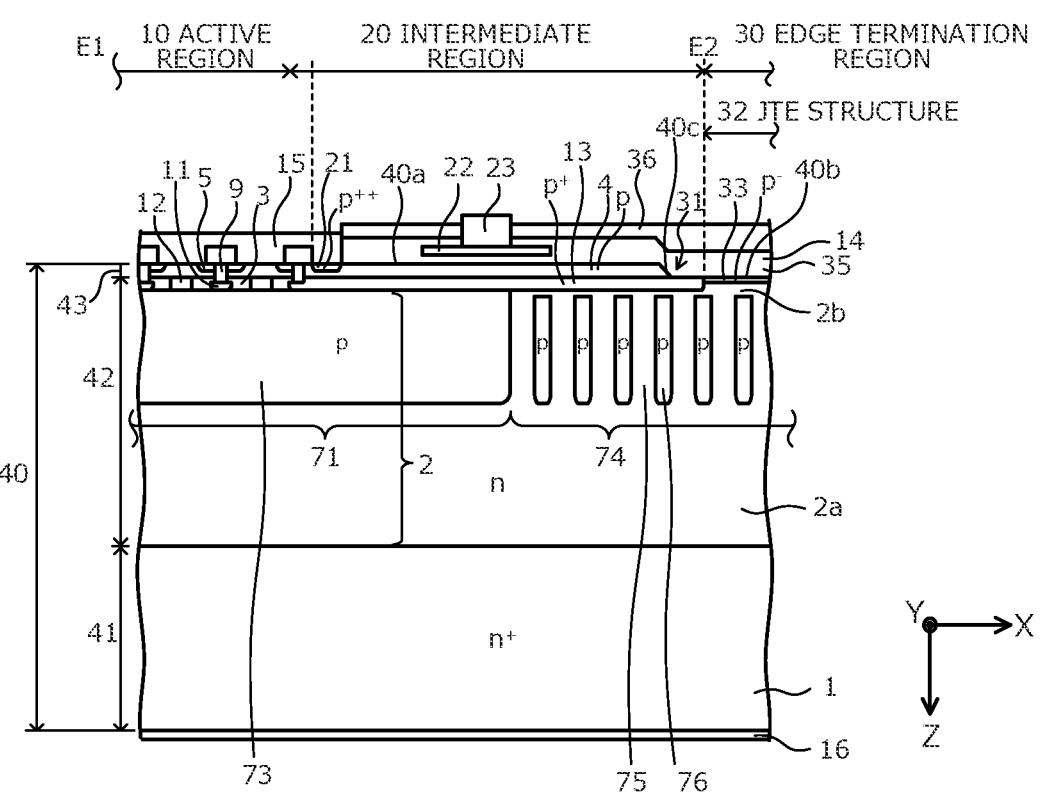
FIG. 10 is a cross-sectional view of the structure along cutting line E1-E2 in FIG. 7.
Figure 11:
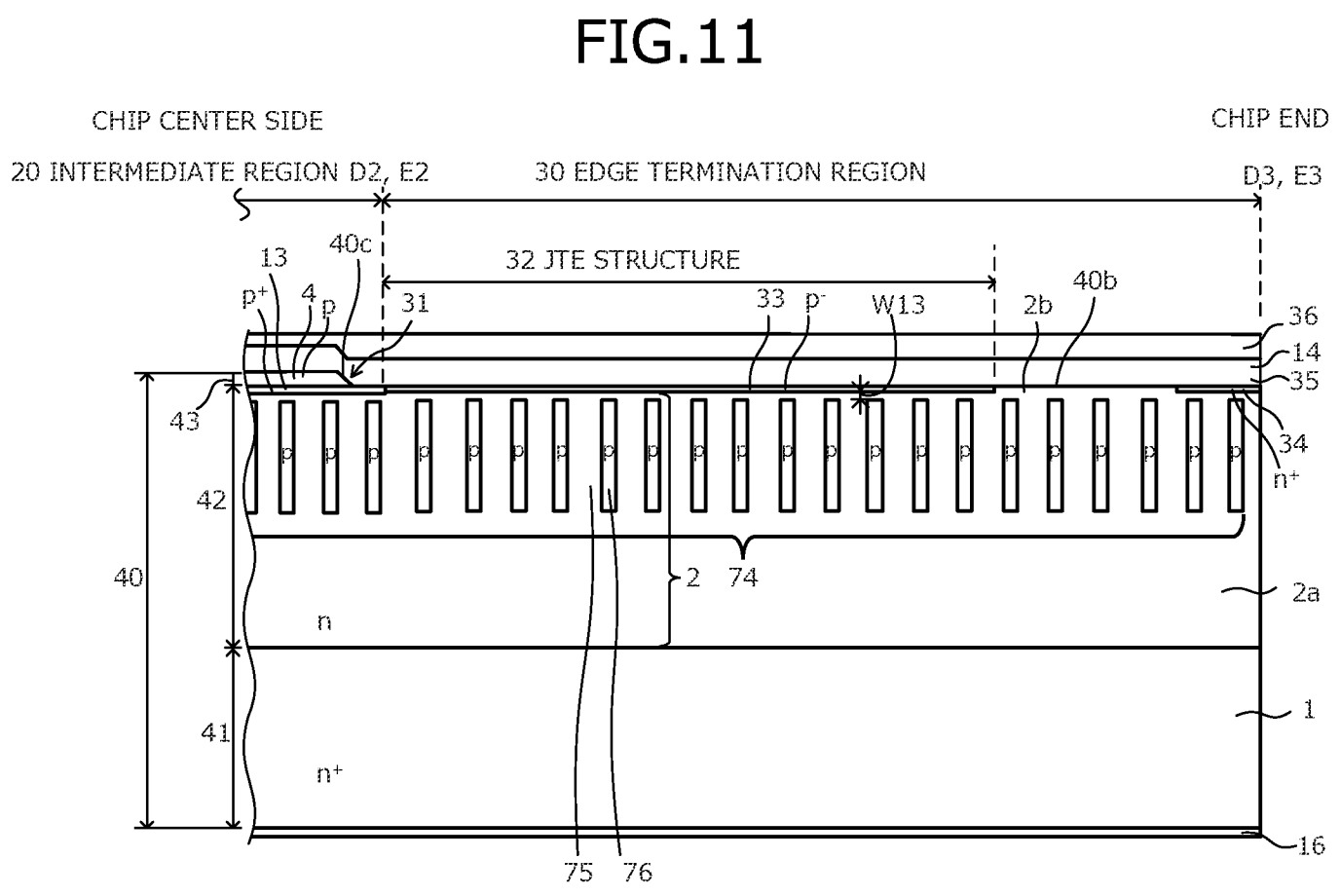

Next, a structure of a silicon carbide semiconductor device according to a third embodiment is described. FIG. 7 is a plan view depicting a layout when the silicon carbide semiconductor device according to the third embodiment is viewed from the front side of the semiconductor substrate thereof. FIG. 8 is an enlarged view of a portion surrounded by a rectangular frame C in FIG. 7. FIGS. 9 and 10 are cross-sectional views of the structure along cutting line D1-D2 and cutting line E1-E2 in FIG. 7. FIG. 11 is a cross-sectional view of the structure along cutting line D2-D3 and cutting line E2-E3 in FIG. 7. Along both cutting line D2-D3 and cutting line E2-E3 in FIG. 7, a second parallel pn layer 74 has a same structure.

A cross-section of the structure in the active region 10 in FIGS. 9 and 10 is that in which reference numerals 51 to 53 in FIG. 2 are changed to reference numerals 71 to 73. In FIG. 7, for example, a layout of the semiconductor substrate 40 that is 3 mm² square is depicted. In FIG. 7, p-type regions 73, 76 of first and second parallel pn layers 71, 74 are indicated by different striped and dotted hatching, respectively. In FIG. 8, the p-type regions 73, 76 of the first and second parallel pn layers 71, 74 are indicated by bold lines and dots, respectively. The number of the n-type regions 72, 75 and the p-type regions 73, 76 of the first and second parallel pn layers 71, 74 depicted in FIGS. 7, 9, and 10 is reduced for simplicity and differs from that in FIG. 8.

A silicon carbide semiconductor device 70 according to the third embodiment differs from the silicon carbide semiconductor device 50 according to the first embodiment (refer to FIGS. 1 and 4) on the following 3 points. A first difference is that the p-type regions 76 of the second parallel pn layer 74 of the edge termination region 30 are disposed in a matrix-like pattern (dotted pattern) and the n-type region 75 surrounds peripheries of the p-type regions 76, as viewed from the front side of the semiconductor substrate 40. A second difference is that a border between the first and second parallel pn layers 71, 74 is positioned in the intermediate region 20. A third difference is that the second parallel pn layer 74 surrounds a periphery of the first parallel pn layer 71.

For example, in the conventional structure (FIGS. 15 to 17), with respect to the multiple p-type regions of the JTE structure 132 extending in a direction of a normal from the chip center to the chip end, among the n-type regions 152 and the p-type regions 153 of the parallel pn layer 151, a portion orthogonal to the JTE structure 132 (in FIG. 16, cross-section parallel to the first direction X) and a portion parallel to the JTE structure 132 (in FIG. 17, cross-section parallel to the second direction Y) are present. Therefore, it is necessary to optimize conditions so that the breakdown voltage becomes substantially the same in both portions in which cross-sections of the structure differ with respect to the direction in which the JTE structure 132 extends, whereby design of the parallel pn layer 151 becomes complicated.

Further, in the conventional structure, among the n-type regions 152 and the p-type regions 153 of the parallel pn layer 151, portions orthogonal to the JTE structure 132 and portions parallel to the JTE structure 132 are present and the breakdown voltage of the edge termination region 130 becomes relatively low by either of these portions. Therefore, when avalanche breakdown occurs in the edge termination region 130 when the MOSFET is OFF, avalanche current generated by the avalanche breakdown concentrates at a portion where the breakdown voltage of the edge termination region 130 is relatively low and avalanche capability decreases at locations where the avalanche current concentrates.

On the other hand, in the third embodiment, the p-type regions 76 of the second parallel pn layer 74 are disposed in a matrix-like pattern, as viewed from the front side of the semiconductor substrate 40, whereby with respect to the direction (direction of the normal) in which the JTE structure 32 extends, a cross-section of the structure of the second parallel pn layer 74 of the edge termination region 30 is substantially the same in the first and second directions X, Y (FIG. 11). Therefore, design may be simplified as compared to in an instance in which a cross-section of the structure of the parallel pn layer 151 differs in the first and the second directions X, Y with respect to the direction in which the JTE structure 132 extends like in the conventional structure.

Further, cross-sections of the structure of the second parallel pn layer 74 in the first and second directions X, Y with respect to the direction in which the JTE structure 32 extends are substantially the same, whereby the edge termination region 30 has substantially the same breakdown voltage throughout. Portions where the breakdown voltage is relatively low do not occur in the edge termination region 30, whereby the breakdown voltage of the edge termination region 30 may be enhanced. Further, a breakdown voltage that is substantially the same in an entire area of the edge termination region 30 may be set, whereby the load of avalanche current may be borne by the edge termination region 30, and the avalanche capability of the edge termination region 30 may be enhanced.

In the third embodiment, close to end corners of the semiconductor substrate 40, a length of the first parallel pn layer 71 of the active region 10 in the second direction Y (longitudinal direction) decreases stepwise in the first direction X from the chip center to the chip end (FIG. 8). The n-type regions 72 and the p-type regions 73 of the first parallel pn layer 71 are in contact with the p⁺-type outer peripheral region 13 in the depth direction Z. The n-type region 75 and the p-type regions 76 of the second parallel pn layer 74 are apart from the p⁺-type outer peripheral region 13, the JTE structure 32, and the n⁺-type channel stopper region (not depicted) (FIGS. 9, 10).

The second parallel pn layer 74 faces the p⁺-type outer peripheral region 13 and the p⁻-type regions 33 of the JTE structure 32 in the depth direction Z. The second parallel pn layer 74 may face the n⁺-type channel stopper region in the depth direction Z. The second parallel pn layer 74 is disposed at a position deeper from the front surface of the semiconductor substrate 40 than are the p⁺-type outer peripheral region 13 and the p⁻-type regions 33 of the JTE structure 32. The normal n⁻-type drift region 2b that is free of the SJ structure is between the p-type regions 76 of the second parallel pn layer 74, the p⁺-type outer peripheral region 13 and the p⁻-type regions 33 of the JTE structure 32.

An interval W13 between the second parallel pn layer 54 and the p⁻-type regions 33 of the JTE structure 32, similarly to the first embodiment, for example, is in a range of about 0.5 μm to 1.5 μm. In the intermediate region 20, the n-type regions 72, 75 of the first and second parallel pn layers 71, 74 are connected to one another. The p-type regions 73, 76 of the first and second parallel pn layers 71, 74 are apart from one another. A border between the first and second parallel pn layers 71, 74 is disposed in the intermediate region 20, whereby close to the border between the intermediate region 20 and the edge termination region 30, a predetermined breakdown voltage of the edge termination region 30 may be stably obtained.

Further, the border between the first and second parallel pn layers 71, 74 is disposed in the intermediate region 20 and the n-type regions 72 and the p-type regions 73 of the first parallel pn layer 71 are disposed in a striped pattern extending in the second direction Y, whereby decreases in the breakdown voltage of the active region 10 due to shifting of the positions of the n-type regions 72 and the p-type regions 73 in the second direction Y are suppressed. Further, the border between the first and second parallel pn layers 71, 74 is disposed in the intermediate region 20, whereby a dotted pattern of the p-type regions 76 of the second parallel pn layer 74 may be disposed deeper than is the JTE structure 32 and therefore, at corner portions (close to 4 vertices of the semiconductor substrate 40) of the edge termination region 30, the layout of the second parallel pn layer 74 becomes equal whether viewed from the first direction X or the second direction Y and uniform breakdown voltage may be obtained.

The n-type region 75 and the p-type regions 76 of the second parallel pn layer 74 are roughly charge balanced. The n-type region 75 and the p-type regions 76 of the second parallel pn layer 74 have substantially the same charge balance as that of the n-type regions 72 and the p-type regions 73 of the first parallel pn layer 71. The n-type region 75 and the p-type regions 76 of the second parallel pn layer 74 suffice to have substantially the same charge balance as that of the n-type regions 72 and the p-type regions 73 of the first parallel pn layer 71 and shapes of the p-type regions 76 of the second parallel pn layer 74 in a plan view may be variously change and, for example, may be substantially rectangular or circular.

As described above, according to the third embodiment, effects similar to those of the first embodiment are obtained. Further, according to the third embodiment, cross-sections of the second parallel pn layer are substantially the same in the first and second directions with respect to the direction in which the JTE structure extends, whereby design may be simplified. Further, a cross-section of the structure of the second parallel pn layer is substantially the same in the first and second directions with respect to the direction in which the JTE structure extends, whereby substantially the same breakdown voltage (static breakdown voltage) may be set in the entire edge termination region, and the breakdown voltage and the avalanche capability (dynamic breakdown voltage) of the edge termination region may be further enhanced.

Figure 12A:
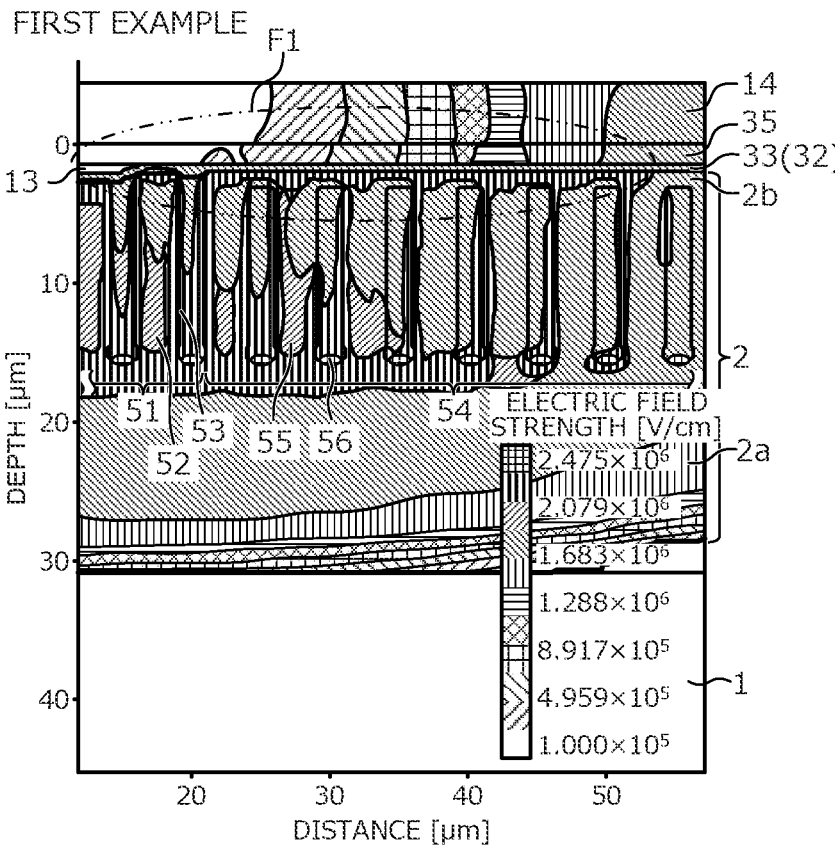
FIG. 12A is a distribution diagram depicting results of simulation of electric field strength of an edge termination region of a first example.
Figure 12B:
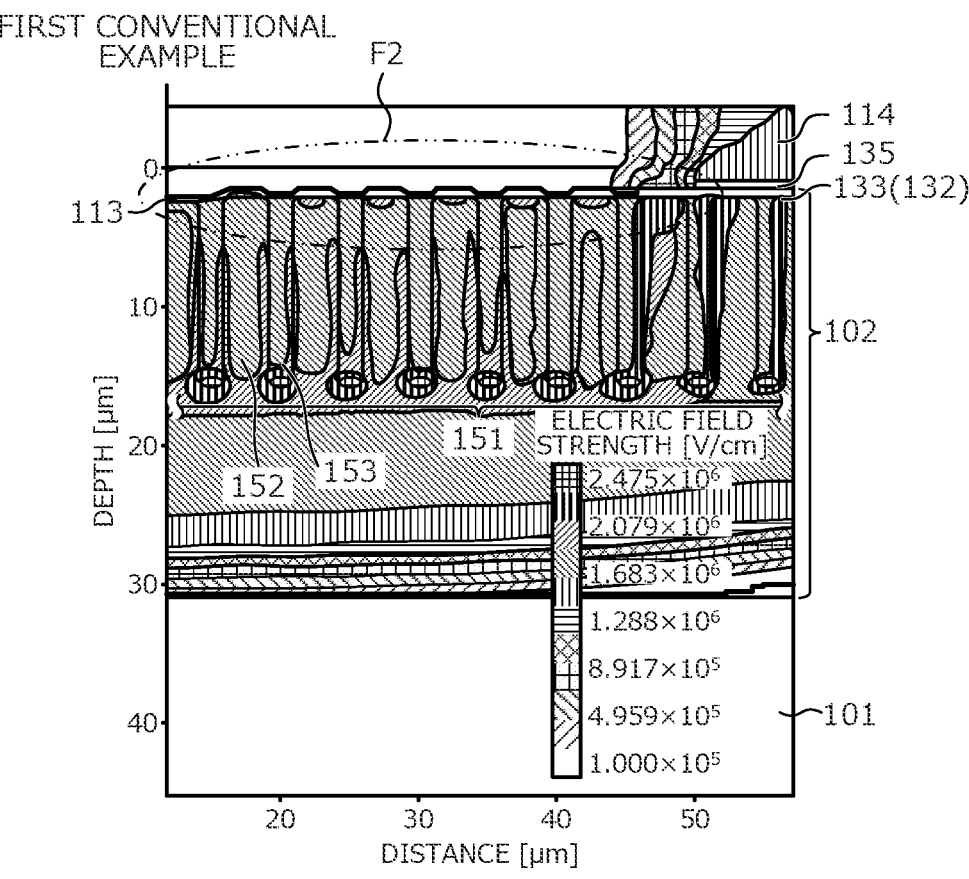
FIG. 12B is a distribution diagram depicting results of simulation of electric field strength of an edge termination region of a first conventional example.

The breakdown voltage of the edge termination region 30 of the silicon carbide semiconductor device 50 according to the first embodiment described above (refer to FIGS. 1 to 4) was verified. FIGS. 12A and 12B are distribution diagrams depicting results of simulation of electric field strength of the edge termination region of a first example and a first conventional example. Electric field strength distribution of the edge termination region 30 of the silicon carbide semiconductor device 50 according to the first embodiment described above (hereinafter, the first example), in the depth direction Z is depicted in FIG. 12A. In other words, in the first example, the second parallel pn layer 54 is disposed apart from the $p^-$-type regions 33 of the JTE structure 32 in the depth direction Z and the normal $n^-$-type drift region 2b that is free of the SJ structure is between the p-type regions 56 of the second parallel pn layer 54 and the $p^-$-type regions 33 of the JTE structure 32.

For comparison, electric field strength distribution of the edge termination region 30 of the conventional silicon carbide semiconductor device 150 (hereinafter, the first conventional example, refer to FIGS. 15 to 17), in the depth direction Z is depicted in FIG. 12B. The first conventional example differs from the first example in that at a portion facing the JTE structure 132 in the depth direction Z, all the p-type regions 153 of the parallel pn layer 151 are in contact with the $p^-$-type region 133 of the JTE structure 132. The impurity concentration and the widths W1n, W2n of the n-type regions 52, 55 of the first and second parallel pn layers 51, 54 in the first example had the same design conditions while the impurity concentration and the widths W1p, W2p of the p-type regions 53, 56 had the same design conditions. The parallel pn layer 151 of the conventional examples had the same design conditions as the first parallel pn layer 51 of the first example.

From the results depicted in FIG. 12B, it was confirmed that in the first conventional example, when the MOSFET is OFF, the $p^-$-type region 133 of the JTE structure 132 does not easily deplete at a portion directly above the connecting portions connected to the p-type regions 153 of the parallel pn layer 151 (portion surrounded by frame F2). On the other hand, from the results depicted in FIG. 12A, it was confirmed that in the first example, when the MOSFET is OFF, the entire JTE structure 32, even the inside of the $p^-$-type regions 33 of the JTE structure 32, is completely depleted by a depletion layer from pn junctions between the $p^-$-type regions 33 of the JTE structure 32 and the normal $n^-$-type drift region 2b (portion surrounded by frame F1). As a result, it was confirmed that the first example may enhance the breakdown voltage of the edge termination region 30 as compared to the first conventional example.

Figure 13:
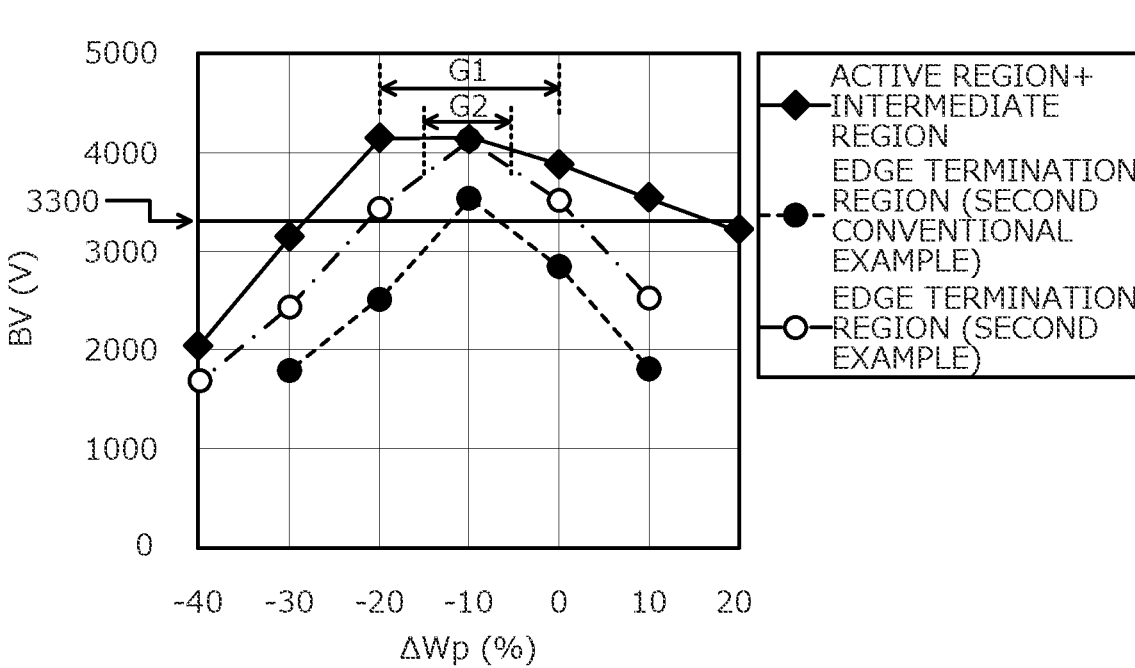
FIG. 13 is a characteristics diagram depicting results of simulation of breakdown voltage of an edge termination region in a second example.

A relationship between the width W2p of the p-type regions 56 of the second parallel pn layer 54 and the breakdown voltage of the edge termination region 30 was verified. FIG. 13 is a characteristics diagram depicting results of simulation of the breakdown voltage of the edge termination region in a second example. Breakdown voltage distribution of the active region 10 and the intermediate region 20 (active region 30 intermediate region) and breakdown voltage distribution of the edge termination region 30 of the silicon carbide semiconductor device 50 according to the first embodiment (hereinafter, second example, refer to FIGS. 1 to 4) are depicted in FIG. 13. The overall breakdown voltage of the second example was set to 3.3 kV. The interval W3 between the second parallel pn layer 54 and the $p^-$-type regions 33 of the JTE structure 32 in the second example was set to 1.0 μm.

Further, in FIG. 13, for comparison, breakdown voltage distribution of the edge termination region 130 of the conventional silicon carbide semiconductor device 150 (hereinafter, second conventional example, refer to FIGS. 15 to 17) is depicted. The second conventional example differs from the second example in that at a portion facing the JTE structure 132 in the depth direction Z, all the p-type regions 153 of the parallel pn layer 151 are in contact with the $p^-$-type region 133 of the JTE structure 132. The breakdown voltage distribution of the active region 110 and the intermediate region 120 (active region+intermediate region) of the second conventional example is the same as that of the second example. The breakdown voltage distribution of the edge termination region 130 of the second conventional example in FIG. 13 is the same as the breakdown voltage distribution of the edge termination region 130 in FIG. 14.

In the second example, in FIG. 13, a horizontal axis indicates the difference ΔWp (%) of the width W2p of the p-type regions 56 of the second parallel pn layer 54 from a central condition and a vertical axis indicates breakdown voltage. The central condition of the width W2p of the p-type regions 56 of the second parallel pn layer 54 corresponds to ΔWp=(the width W1p of the p-type regions 53 of the first parallel pn layer 51−the width W2p of the p-type regions 56 of the second parallel pn layer 54)/(the width W1p of the p-type regions 53 of the first parallel pn layer 51)=0% in FIG. 13, with respect to the width W1p of the p-type regions 53 of the first parallel pn layer 51, which satisfies "impurity concentration of the n-type regions 52×the width W1n of the n-type regions 52=impurity concentration of the p-type regions 53×the width W1p of the p-type regions 53".

An instance of ΔWp<0% and an instance of ΔWp>0% are, respectively, an instance in which the width W2p of the p-type regions 56 of the second parallel pn layer 54 is wider than the width W1p of the p-type regions 53 of the first parallel pn layer 51 and an instance in which the width W2p is narrower than the width W1p. In the second conventional example, the difference ΔWp (%) indicated on the horizontal axis in FIG. 13 is the same as that indicated by a horizontal axis in FIG. 14. In the second conventional example, in an instance in which the breakdown voltage is set to 3.3 kV, the width Wp of the p-type regions 153 of the parallel pn layer 151 of the edge termination region 130 is set to ΔWp=about −10%, whereby the breakdown voltage is at least 3.3 kV in the active region 110 and in the edge termination region 130.

On the other hand, from the results depicted in FIG. 13, it was confirmed that in the second example, independent of the width W2p of the p-type regions 56 of the second parallel pn layer 54, the breakdown voltage of the edge termination region 30 is smaller than the breakdown voltage of the active region 10 and the intermediate region 20; nonetheless, the breakdown voltage of the edge termination region 30 is high as compared to the second conventional example. The second example is compared with the second conventional example in which the widths of the p-type regions 153 of the parallel pn layer 151 of the active region 110 and the edge termination region 130 are set to be the same as the widths W1p, W2p of the p-type regions 53, 56 of the first and second parallel pn layers 51, 54 of the second example.

In the second example, it was confirmed that by increasing the width W2p of the p-type regions 56 of the second parallel pn layer 54 within a range of not more than about 20% greater than the width W1p of the p-type regions 53 of the first parallel pn layer 51 (maximum ΔWp=−20%), the breakdown voltage of the edge termination region 30 could be set to a prescribed breakdown voltage (3.3 kV) or higher. Further, by increasing the width W2p of the p-type regions 56 of the second parallel pn layer 54 to be in a range of about 5% to 15% greater than the width W1p of the p-type regions 53 of the first parallel pn layer 51 (ΔWp=−15% to −5%), the breakdown voltage of the edge termination region 30 may be further increased.

For example, a range in which the width of the p-type regions 153 of the edge termination region 130 of the conventional examples may be increased is about 10%±2% greater than the width of the p-type regions 153 of the active region 110 and therefore, it is found that the second example has a higher degree of freedom in the design of the second parallel pn layer 54 of the edge termination region 30, as compared to the conventional examples. Further, it was confirmed that in the second example, the width W2*p* of the p-type regions 56 of the second parallel pn layer 54 is increased to be about 10% wider than the width W1*p* of the p-type regions 53 of the first parallel pn layer 51, whereby the breakdown voltage of the edge termination region 30 may be increased to about the breakdown voltage of the active region 10.

In the foregoing, the present invention is not limited to the embodiments described above and various modifications within a range not departing from the spirit of the invention are possible. For example, in the embodiments described above, the impurity concentration of the normal n-type drift region that is free of the SJ structure and between parallel pn layer and the n⁺-type starting substrate may be higher than the impurity concentration of the n-type regions of the parallel pn layer. Further, the present invention is similarly implemented when the conductivity types (n-type, p-type) are reversed.

According to the invention described above, during the OFF state, complete depletion, even into the first semiconductor region configuring the voltage withstanding structure, is possible and the breakdown voltage of the edge termination region may be enhanced.

The silicon carbide semiconductor device according to the present invention achieves an effect in that the breakdown voltage of the edge termination region may be set close to the breakdown voltage of the active region, whereby the overall breakdown voltage of the silicon carbide semiconductor device may be enhanced.

As described above, the silicon carbide semiconductor device according to the present invention is useful for power semiconductor devices having a SJ structure, used in power converting equipment, power source devices such as in various types of industrial machines, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a semiconductor substrate containing silicon carbide, the semiconductor substrate having an active region and a termination region that surrounds a periphery of the active region in a top view of the silicon carbide semiconductor device, the semiconductor substrate having a first main surface and a second main surface that are opposite to each other;
a first parallel pn layer provided in the semiconductor substrate in the active region, the first parallel pn layer having disposed therein a plurality of first first-conductivity-type regions and a plurality of first second-conductivity-type regions repeatedly alternating with one another in a first direction that is parallel to the first main surface of the semiconductor substrate;
a second parallel pn layer provided in the semiconductor substrate, adjacent to the first parallel pn layer and in the termination region, the second parallel pn layer having disposed therein a plurality of second first-conductivity-type regions and a plurality of second second-conductivity-type regions repeatedly alternating with one another in the first direction;
a device structure provided in the active region, between the first main surface of the semiconductor substrate and the first parallel pn layer;
a first electrode provided on the first main surface of the semiconductor substrate, and electrically connected to the device structure;
a second electrode provided on the second main of the semiconductor substrate;
a first semiconductor region of a second conductivity type electrically connected to the first electrode, the first semiconductor region being selectively provided in the termination region, between the first main surface of the semiconductor substrate and the second parallel pn layer, and surrounding the periphery of the active region, the second parallel pn layer being provided apart from the first semiconductor region, at a position deeper from the first main surface of the semiconductor substrate than is the first semiconductor region and closer to an end of the semiconductor substrate than is an outer end of the first semiconductor region;
a second semiconductor region of a first conductivity type, provided between the second parallel pn layer and the first semiconductor region, and in contact with the first semiconductor region; and
a channel stopper region configuring a voltage withstanding structure with the first semiconductor region, the channel stopper region being disposed apart from the first semiconductor region and closer to the end of the semiconductor substrate than is the first semiconductor region, wherein
the second semiconductor region has a portion that is disposed between the channel stopper region and the second parallel pn layer, and separates the channel stopper region from the second parallel pn layer, and
upper ends of the plurality of second second-conductivity-type regions are flat.

2. The silicon carbide semiconductor device according to claim 1, wherein
each of the plurality of second second-conductivity-type regions is disposed so as not to be electrically connected to the first electrode.

3. The silicon carbide semiconductor device according to claim 1, wherein
the plurality of first first-conductivity-type regions and the plurality of first second-conductivity-type regions each extend in a second direction that is parallel to the first main surface of the semiconductor substrate and orthogonal to the first direction, to thereby form a first striped pattern,
the plurality of second first-conductivity-type regions and the plurality of second second-conductivity-type regions each extend in the second direction, to thereby form a second striped pattern, and
the second parallel pn layer is adjacent to the first parallel pn layer in the first direction.

4. The silicon carbide semiconductor device according to claim 1, wherein
the plurality of first first-conductivity-type regions and the plurality of first second-conductivity-type regions each extend in a second direction that is parallel to the first main surface of the semiconductor substrate and orthogonal to the first direction, to thereby form a first striped pattern, the plurality of second first-conductivity-type regions and the plurality of second second-conductivity-type regions each extend in the second direction, to thereby form a second striped pattern, the second parallel pn layer is adjacent to the first parallel pn layer in the first direction, and the silicon carbide semiconductor device further comprises a second-conductivity-type connecting region that connects the plurality of second second-conductivity-type regions to the plurality of first second-conductivity-type regions, the second-conductivity-type connecting region being selectively provided in the semiconductor substrate, in the termination region, wherein the second-conductivity-type connecting region extends linearly, is closer to the end of the semiconductor substrate than is the outer end of the first semiconductor region in the first direction, and connects one end of each of the plurality of first second-conductivity-type regions with one end of each of the plurality of second second-conductivity-type regions.

5. The silicon carbide semiconductor device according to claim 4, wherein the first parallel pn layer further extends from the active region to a position that is closer to the end of the semiconductor substrate in the first direction than is an inner end of the first semiconductor region, and at least one of the plurality of first second-conductivity-type regions is adjacent to the first semiconductor region in a depth direction of the silicon carbide semiconductor device.

6. The silicon carbide semiconductor device according to claim 3, wherein each of the plurality of second second-conductivity-type regions has a width that is up to 20% wider than a width of each of the plurality of first second-conductivity-type regions.

7. The silicon carbide semiconductor device according to claim 6, wherein the width of each of the plurality of second second-conductivity-type regions is 5% to 15% wider than the width of each of the plurality of first second-conductivity-type regions.

8. The silicon carbide semiconductor device according to claim 3, wherein the second parallel pn layer is provided to a position that is at most 10 μm closer to the end of the semiconductor substrate than is the outer end of the first semiconductor region in the first direction.

9. The silicon carbide semiconductor device according to claim 4, wherein each of the plurality of second second-conductivity-type regions has a width that is up to 20% wider than a width of each of the plurality of first second-conductivity-type regions.

10. The silicon carbide semiconductor device according to claim 9, wherein the width of each of the plurality of second second-conductivity-type regions is 5% to 15% wider than the width of each of the plurality of first second-conductivity-type regions.

11. The silicon carbide semiconductor device according to claim 4, wherein the second parallel pn layer is provided to a position that is at most 10 μm closer to the end of the semiconductor substrate than is the outer end of the first semiconductor region in the first direction.

12. The silicon carbide semiconductor device according to claim 1, wherein the plurality of first first-conductivity-type regions and the plurality of first second-conductivity-type regions each extend in a second direction that is parallel to the first main surface of the semiconductor substrate and orthogonal to the first direction, to thereby form a striped pattern, the plurality of second second-conductivity-type regions is disposed in a matrix-like pattern in the top view, the plurality of second first-conductivity-type regions is disposed in a lattice-like shape surrounding the plurality of second second-conductivity-type regions in the top view, and the second parallel pn layer surrounds the first parallel pn layer.

13. The silicon carbide semiconductor device according to claim 12, wherein the semiconductor substrate further includes an intermediate region that is between the active region and the termination region in the top view, and a border between the first parallel pn layer and the second parallel pn layer is positioned in the intermediate region.

14. The silicon carbide semiconductor device according to claim 1, wherein a distance between the second parallel pn layer and the first semiconductor region, in a depth direction of the silicon carbide semiconductor device, is in a range of 0.5 μm to 1.5 μm.

* * * * *